(12) United States Patent
Park et al.

(10) Patent No.: US 11,881,509 B2
(45) Date of Patent: Jan. 23, 2024

(54) SEMICONDUCTOR DEVICE

(71) Applicant: Samsung Electronics Co., Ltd., Suwon-si (KR)

(72) Inventors: Junbeom Park, Seoul (KR); Sangmo Koo, Seoul (KR); Minyi Kim, Hwaseong-si (KR); Seokhyeon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 341 days.

(21) Appl. No.: 17/396,942

(22) Filed: Aug. 9, 2021

(65) Prior Publication Data

US 2022/0199775 A1 Jun. 23, 2022

(30) Foreign Application Priority Data

Dec. 22, 2020 (KR) .................. 10-2020-0181225

(51) Int. Cl.
*H01L 29/08* (2006.01)
*H01L 29/66* (2006.01)
*H01L 29/10* (2006.01)

(52) U.S. Cl.
CPC ...... *H01L 29/0847* (2013.01); *H01L 29/1033* (2013.01); *H01L 29/66553* (2013.01)

(58) Field of Classification Search
CPC ............. H01L 29/0847; H01L 29/1033; H01L 29/66553; H01L 29/42392; H01L 23/485; H01L 29/7848; H01L 29/161; H01L 29/165
See application file for complete search history.

(56) References Cited

U.S. PATENT DOCUMENTS

| | | | |
|---|---|---|---|
| 8,969,965 B2 | 3/2015 | Chang et al. | |
| 10,170,638 B1* | 1/2019 | Reznicek | ............ H01L 29/0649 |
| 10,297,675 B1 | 5/2019 | Vinslava et al. | |
| 10,535,773 B2 | 1/2020 | Guo et al. | |
| 10,636,874 B2 | 4/2020 | Lee et al. | |
| 2005/0169096 A1 | 8/2005 | Lee et al. | |
| 2006/0024874 A1 | 2/2006 | Yun et al. | |
| 2006/0091481 A1 | 5/2006 | Li et al. | |
| 2019/0393336 A1 | 12/2019 | Leib et al. | |

(Continued)

FOREIGN PATENT DOCUMENTS

| | | | |
|---|---|---|---|
| KR | 100555567 B1 | 3/2006 | |
| KR | 100652381 B1 | 12/2006 | |
| KR | 100652407 B1 | 12/2006 | |

*Primary Examiner* — Changhyun Yi
(74) *Attorney, Agent, or Firm* — Harness, Dickey & Pierce, P.L.C.

(57) ABSTRACT

The semiconductor device may include an active pattern provided on a substrate and a source/drain pattern on the active pattern. The source/drain pattern may include a bottom surface in contact with a top surface of the active pattern. The semiconductor device may further include a channel pattern connected to the source/drain pattern, a gate electrode extended to cross the channel pattern, and a fence insulating layer extended from a side surface of the active pattern to a lower side surface of the source/drain pattern. A pair of middle insulating patterns may be at both sides of the bottom surface of the source/drain pattern and between the active pattern and the source/drain pattern in contact with an inner side surface of the fence insulating layer.

20 Claims, 37 Drawing Sheets

(56) References Cited

U.S. PATENT DOCUMENTS

| | | |
|---|---|---|
| 2020/0006333 A1 | 1/2020 | Noh et al. |
| 2022/0029023 A1* | 1/2022 | Chen ................ H01L 29/42392 |
| 2022/0262925 A1* | 8/2022 | Yu .................... H01L 29/78618 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2020-0181225, filed on Dec. 22, 2020, in the Korean Intellectual Property Office, the entire contents of which are hereby incorporated by reference.

BACKGROUND OF THE INVENTION

The present disclosure relates to semiconductor devices, and in particular, to semiconductor devices including a field effect transistor.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

Example embodiments of the inventive concepts provide a semiconductor device with improved electric characteristics.

According to example embodiments of the inventive concepts, a semiconductor device may include active pattern on a substrate, a source/drain pattern on the active pattern, the source/drain pattern including a bottom surface in contact with a top surface of the active pattern, a channel pattern connected to the source/drain pattern, a gate electrode extended to cross the channel pattern, a fence insulating layer extended from a side surface of the active pattern to a lower side surface of the source/drain pattern, and a pair of middle insulating patterns at both sides of the bottom surface of the source/drain pattern and between the active pattern and the source/drain pattern in contact with an inner side surface of the fence insulating layer.

According to example embodiments of the inventive concepts, a semiconductor device may include a substrate including a PMOSFET region and an NMOSFET region, which are adjacent to each other in a first direction, a first active pattern and a second active pattern on the PMOSFET region and the NMOSFET region, respectively, a first source/drain pattern on the first active pattern and a second source/drain pattern on the second active pattern, a first gate electrode and a second gate electrode crossing the first and second active patterns, respectively, and extending in the first direction, a first channel pattern connected to the first source/drain pattern and a second channel pattern connected to the second source/drain pattern, each of the first and second channel patterns including a first semiconductor pattern, a second semiconductor pattern and a third semiconductor pattern, which are sequentially stacked to be spaced apart from each other, and a pair of middle insulating patterns between the second source/drain pattern and the second active pattern and at both sides of a bottom surface of the second source/drain pattern in contact with a top surface of the second active pattern. The pair of middle insulating patterns may be on the NMOSFET region.

According to example embodiments of the inventive concepts, a semiconductor device may include a substrate including a PMOSFET region and an NMOSFET region, which are adjacent to each other in a first direction, a first active pattern and a second active pattern on the PMOSFET and NMOSFET regions, respectively, a first source/drain pattern on the first active pattern and a second source/drain pattern on the second active pattern, a first channel pattern connected to the first source/drain pattern and a second channel pattern connected to the second source/drain pattern, each of the first and second channel patterns including a first semiconductor pattern, a second semiconductor pattern, and a third semiconductor pattern, which are sequentially stacked to be spaced apart from each other, a first fence insulating layer extended from a side surface of the first active pattern to a lower side surface of the first source/drain pattern, a second fence insulating layer extended from a side surface of the second active pattern to a lower side surface of the second source/drain pattern, a pair of middle insulating patterns at both sides of a bottom surface of the second source/drain pattern and between the second active pattern and the second source/drain pattern to be in contact with an inner side surface of the second fence insulating layer, a first gate electrode and a second gate electrode crossing the first and second active patterns, respectively, and extending in the first direction, each of the first and second gate electrodes including a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern, inner spacers respectively between the first to third portions of the second gate electrode and the second source/drain pattern, a first gate insulating layer and a second gate insulating layer respectively between the first channel pattern and the first gate electrode and between the second channel pattern and the second gate electrode, a first gate spacer and a second gate spacer on side surfaces of the first and second gate electrodes, respectively, a first gate capping pattern and a second gate capping pattern on top surfaces of the first and second gate electrodes, respectively, a first interlayer insulating layer on the first and second gate capping patterns, active contacts penetrating the first interlayer insulating layer and coupled to the first and second source/drain patterns, respectively, gate contacts penetrating the first interlayer insulating layer and coupled to the first and second gate electrodes, respectively, a second interlayer insulating layer on the first interlayer insulating layer, a first metal layer in the second interlayer insulating layer, the first metal layer including first interconnection lines, which are electrically connected to the active contacts and the gate contacts, respectively, a third interlayer insulating layer on the second interlayer insulating layer, and a second metal layer in the third interlayer insulating layer, the second metal layer including second interconnection lines, which are electrically connected to the first interconnection lines, respectively.

DETAILED DESCRIPTION

Example embodiments of the inventive concepts will now be described more fully with reference to the accompanying drawings, in which example embodiments are shown.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
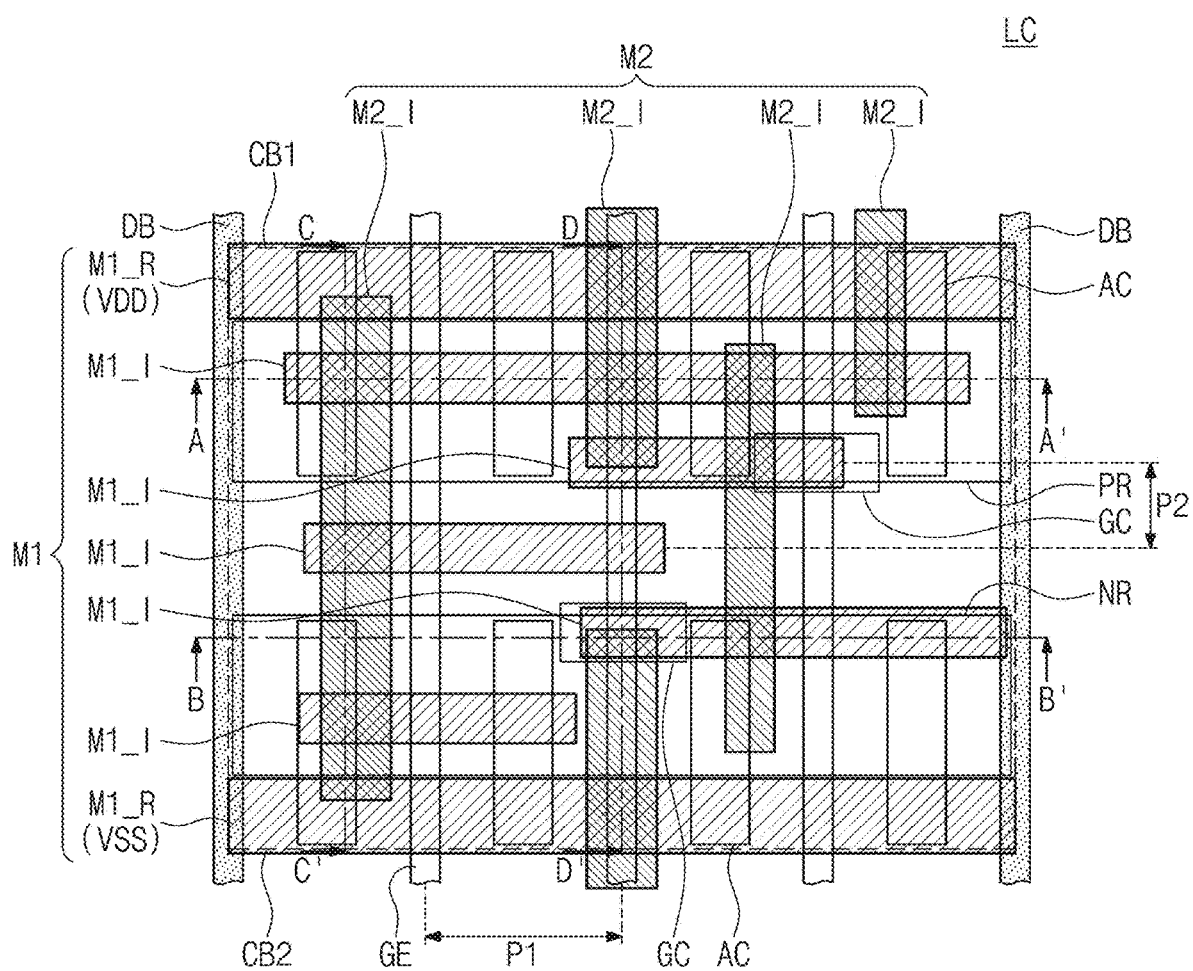
FIG. 1 is a plan view illustrating a semiconductor device according to example embodiments of the inventive concepts.
Figure 1:
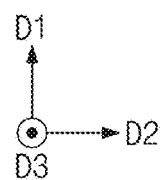
Figure 2A:
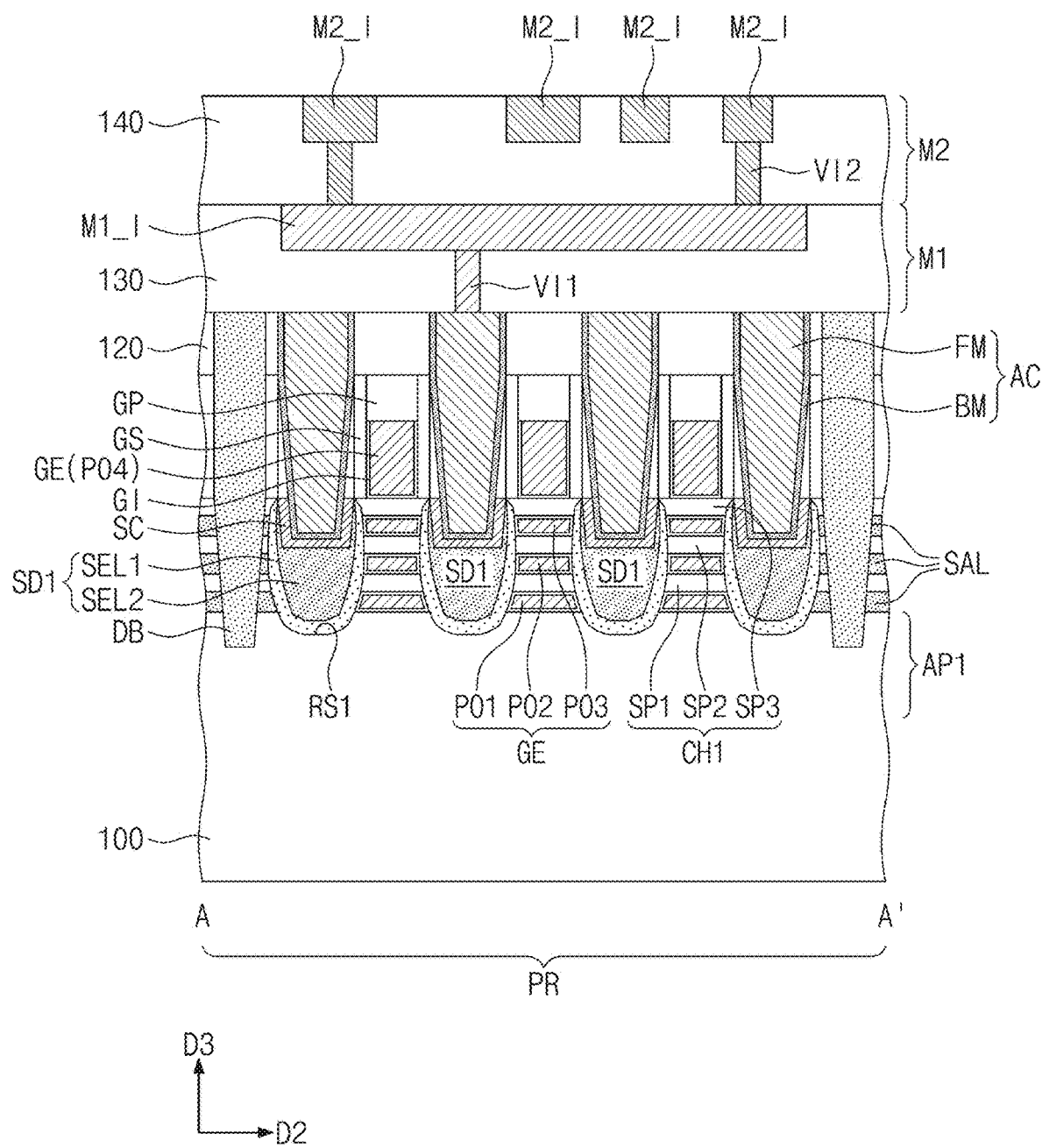
FIGS. 2A to 2D are sectional views taken along lines A-A', B-B', C-C', and D-D', respectively, of FIG. 1.
Figure 2B:
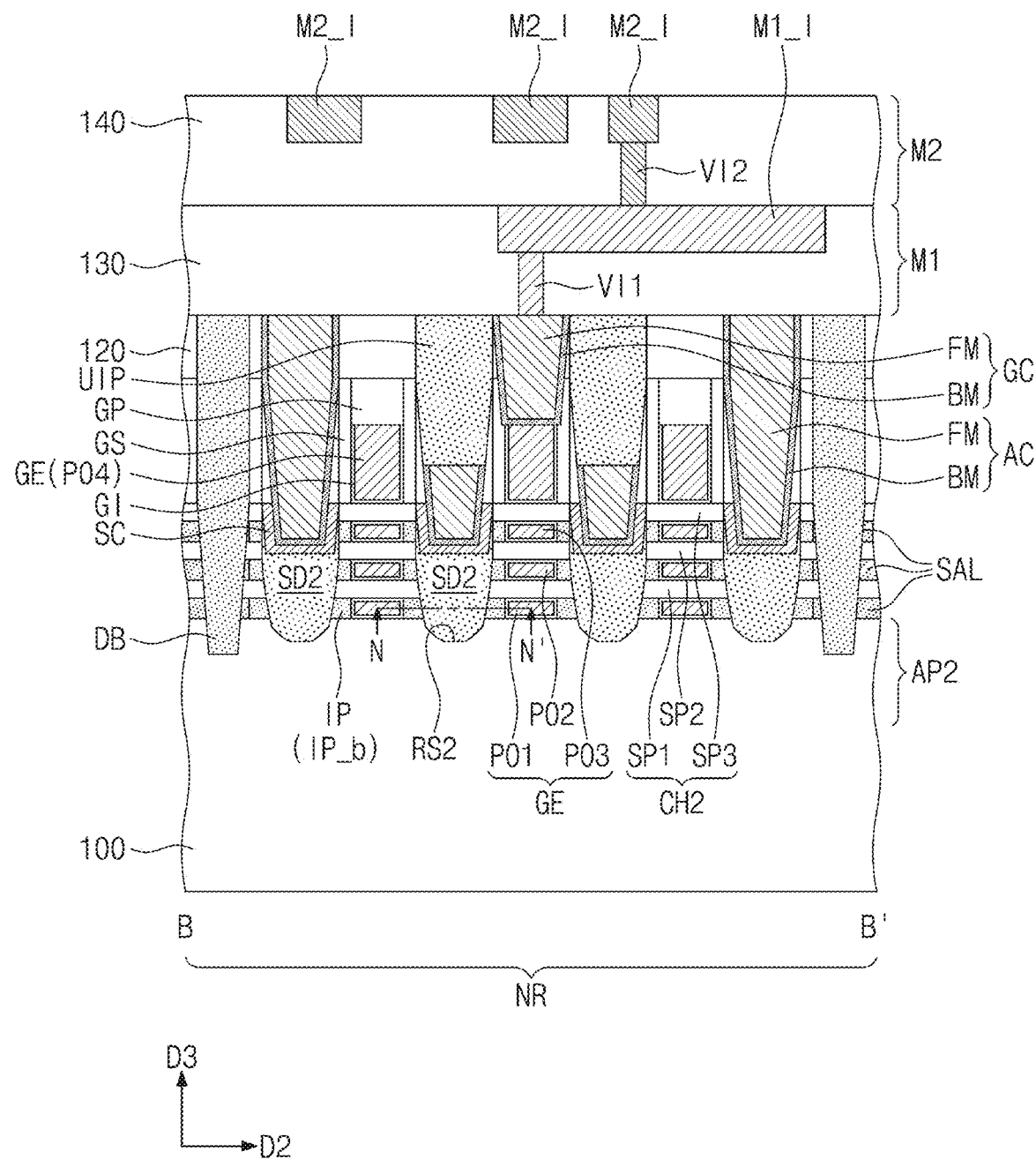

FIG. 1 is a plan view illustrating a semiconductor device according to example embodiments of the inventive concepts. FIGS. 2A to 2D are sectional views taken along lines A-A', B-B', C-C', and D-D', respectively, of FIG. 1. FIGS. 3A and 3B are enlarged sectional views illustrating a portion Q of FIG. 2C. FIG. 3C is an enlarged plan view, which is taken at a level of a line N-N' of FIG. 2B.

Referring to FIGS. 1 and 2A to 2D, a logic cell LC may be provided on a substrate 100. Logic transistors constituting a logic circuit may be disposed on the logic cell LC. The substrate 100 may be a semiconductor substrate, which is formed of, or includes, silicon, germanium, silicon-germanium, or the like, and/or a compound semiconductor substrate. As an example, the substrate 100 may be a silicon wafer.

The logic cell LC may include a PMOSFET region PR and an NMOSFET region NR. The PMOSFET and NMOSFET regions PR and NR may be defined by a second trench TR2, which is formed in an upper portion of the substrate 100. In other words, the second trench TR2 may be placed between the PMOSFET and NMOSFET regions PR and NR. The PMOSFET and NMOSFET regions PR and NR may be spaced apart from each other, in a first direction D1, with the second trench TR2 interposed therebetween.

A first active pattern AP1 and a second active pattern AP2 may be defined by a first trench TR1, which is formed in an upper portion of the substrate 100. The first and second active patterns AP1 and AP2 may be provided on each of the PMOSFET and NMOSFET regions PR and NR. The first trench TR1 may be shallower than the second trench TR2. The first and second active patterns AP1 and AP2 may be extended in a second direction D2. The first and second active patterns AP1 and AP2 may be vertically-protruding portions of the substrate 100.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). The device isolation layer ST may not cover the upper portions of the first and second active patterns AP1 and AP2. The device isolation layer ST may cover lower side surfaces of the first and second active patterns AP1 and AP2.

A liner insulating layer LIN may be provided between the device isolation layer ST and the first and second active patterns AP1 and AP2. The liner insulating layer LIN may be conformally provided along the first and second trenches TR1 and TR2. In example embodiments, the liner insulating layer LIN may be formed of, or include, SiN or SiON.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of, or include, silicon (Si), germanium (Ge), and/or silicon-germanium (SiGe). In example embodiments, each of the first to third semiconductor patterns SP1, SP2, and SP3 may be formed of, or include, crystalline silicon.

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3 of the second channel pattern CH2.

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. However, in some example embodiments, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween.

The second source/drain patterns SD2 may be formed of, or include, the same semiconductor material (e.g., Si) as the substrate 100. In example embodiments, the second source/drain patterns SD2 may be formed of, or include, single-crystalline silicon.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be larger than a volume of the first semiconductor layer SEL1. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of, or include, silicon-germanium (SiGe). In detail, the first semiconductor layer SEL1 may be provided to have a relatively low germanium concentration. In some example embodiments, the first semiconductor layer SEL1 may be provided to contain only silicon (Si) and not germanium (Ge). The germanium concentration of the first semiconductor layer SEL1 may range from about 0 at % to about 10 at % ("at" being atomic percentage).

The second semiconductor layer SEL2 may be provided to have a relatively high germanium concentration. As an example, the germanium concentration of the second semiconductor layer SEL2 may range from about 30 at % to about 70 at %. The germanium concentration of the second semiconductor layer SEL2 may increase in the third direction D3, e.g., the germanium concentration may be a gradient. For example, the germanium concentration of the second semiconductor layer SEL2 may be about 40 at % near the first semiconductor layer SEL1 but may be about 60 at % at its top level. The change in germanium concentration between the second semiconductor layer SEL2 and the first semiconductor layer SEL1 may be linear, or may be follow a logarithmic distribution, however, example embodiments are not limited thereto.

The first and second semiconductor layers SEL1 and SEL2 may include impurities (e.g., boron), allowing the first source/drain pattern SD1 to have the p-type conductivity. In some example embodiments, a concentration of impurities in the second semiconductor layer SEL2 (in at %) may be greater than that in the first semiconductor layer SEL1. The change in impurity concentration between the second semiconductor layer SEL2 and the first semiconductor layer SEL1 may be linear, or may be follow a logarithmic distribution, however, example embodiments are not limited thereto.

Gate electrodes GE may be provided to cross the first and second active patterns AP1 and AP2 and to extend in the first direction D1. The gate electrodes GE may be arranged with a first pitch P1 in the second direction D2. Each of the gate electrodes GE may be overlapped with the first and second channel patterns CH1 and CH2 when viewed in a plan view.

The gate electrode GE may include a first portion P01 interposed between the substrate 100 and the first semiconductor pattern SP1, a second portion P02 interposed between the first semiconductor pattern SP1 and the second semiconductor pattern SP2, a third portion P03 interposed between the second semiconductor pattern SP2 and the third semiconductor pattern SP3, and a fourth portion P04 on the third semiconductor pattern SP3.

Referring back to FIG. 2A, the first to third portions P01, P02, and P03 of the gate electrode GE on the PMOSFET region PR may have different widths from each other. For example, the largest width of the third portion P03 in the second direction D2 may be larger than the largest width of the second portion P02 in the second direction D2. The largest width of the first portion P01 in the second direction D2 may be larger than the largest width of the third portion P03 in the second direction D2.

Referring back to FIG. 2D, the gate electrode GE may be provided on a top surface TS, a bottom surface BS, and opposite side surfaces SW of each of the first to third semiconductor patterns SP1, SP2, and SP3. In other words, the logic transistor according to the present example embodiments may be a three-dimensional field-effect transistor (e.g., multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on opposite side surfaces of the fourth portion P04 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of, or include, at least one of SiCN, SiCON, or SiN. In some example embodiments, the gate spacers GS may have a multi-layered structure including at least two layers, each of which is made of SiCN, SiCON, or SiN.

A gate capping pattern GP may be provided on the gate electrode GE. The gate capping pattern GP may be extended along the gate electrode GE and in the first direction D1. The gate capping pattern GP may be formed of, or include, a material having an etch selectivity with respect to first and second interlayer insulating layers 110 and 120, which will be described below. For example, the gate capping patterns GP may be formed of, or include, at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 2D).

In some example embodiments, the gate insulating layer GI may include a silicon oxide layer, a silicon oxynitride layer, and/or a high-k dielectric layer. The high-k dielectric layer may be formed of, or include, at least one of high-k dielectric materials whose dielectric constants are higher than that of silicon oxide. As an example, the high-k dielectric materials may be formed of, or include, at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate. In some example embodiments, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance, and the paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at room temperature.

The ferroelectric layer may have a ferroelectric material property. The ferroelectric layer may be formed of, or include, at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants include aluminum (Al), a content of aluminum in the ferroelectric layer may range from about 3 at % to about 8 at % ("at" being atomic percentage). Here, the content of the aluminum in the dopants may be a ratio of the number of aluminum atoms to the number of hafnium and aluminum atoms.

In the case where the dopants include silicon (Si), a content of silicon in the ferroelectric layer may range from about 2 at % to about 10 at %. In the case where the dopants include yttrium (Y), a content of yttrium in the ferroelectric layer may range from about 2 at % to about 10 at %. In the case where the dopants include gadolinium (Gd), a content of gadolinium in the ferroelectric layer may range from about 1 at % to about 7 at %. In the case where the dopants include zirconium (Zr), a content of zirconium in the ferroelectric layer may range from about 50 at % to about 80 at %.

The paraelectric layer may have a paraelectric material property. The paraelectric layer may be formed of, or include, at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of, or include, the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, for example, the ferroelectric material property may only present when the ferroelectric layer is in a specific range of thickness. In some example embodiments, the ferroelectric layer may have a thickness ranging from 0.5 to 10 nm, but the inventive concepts are not limited to this example. Since a thickness of the ferroelectric layer associated with the ferroelectric material property varies depending on the kind of the ferroelectric material, the thickness of the ferroelectric layer may be changed depending on the kind of the ferroelectric material.

As an example, the gate insulating layer may include a single ferroelectric layer. As another example, the gate insulating layer may include a plurality of ferroelectric layers spaced apart from each other. The gate insulating layer may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions P01, P02, and P03 of the gate electrode GE may be composed of the first metal pattern or the work function metal.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). In some example embodiments, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta). For example, the fourth portion P04 of the gate electrode GE may include the first metal pattern and the second metal pattern on the first metal pattern.

Referring back to FIG. 2B, inner spacers IP may be provided on the NMOSFET region NR. Each of the inner spacers IP may be interposed between the second source/drain pattern SD2 and a corresponding one of the first to third portions P01, P02, and P03 of the gate electrode GE. The inner spacers IP may be in direct contact with the second source/drain pattern SD2. Each of the first to third portions P01, P02, and P03 of the gate electrode GE may be spaced apart from the second source/drain pattern SD2 by the inner spacer IP. The inner spacer IP will be described in more detail with reference to FIGS. 3A to 3C.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In some example embodiments, at least one of the first and second interlayer insulating layers 110 and 120 may include a silicon oxide layer.

A pair of dividing structures DB, which are opposite to each other in the second direction D2, may be provided at both sides of the logic cell LC. The dividing structure DB may be extended in the first direction D1 and parallel to the gate electrodes GE. A pitch between the dividing structure DB and the gate electrode GE adjacent to each other may be equal to the first pitch P1.

The dividing structure DB may be provided to penetrate the first and second interlayer insulating layers 110 and 120 and may be extended into the first and second active patterns AP1 and AP2. The dividing structure DB may penetrate an upper portion of each of the first and second active patterns AP1 and AP2. The dividing structure DB may separate the PMOSFET and NMOSFET regions PR and NR of the logic cell LC from an active region of another logic cell adjacent thereto.

Sacrificial layers SAL adjacent to the dividing structure DB may be provided on each of the first and second active patterns AP1 and AP2. The sacrificial layers SAL may be stacked to be spaced apart from each other. Each of the sacrificial layers SAL may be located at the same level as a corresponding one of the first to third portions P01, P02, and P03 of the gate electrode GE. The dividing structure DB may be provided to penetrate the sacrificial layers SAL.

The sacrificial layers SAL may be formed of, or include, silicon-germanium (SiGe). A germanium concentration of each of the sacrificial layers SAL may range from about 10 at % to about 30 at %. The germanium concentration of the sacrificial layer SAL may be higher than the germanium concentration of the first semiconductor layer SEL1 described above.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may have a bar shape elongated in the first direction D1.

The active contact AC may be a self-aligned contact. For example, the active contact AC may be formed by a self-alignment process using the gate capping pattern GP and the gate spacer GS. In some example embodiments, the active contact AC may cover at least a portion of a side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of, or include, at least one of metal silicide materials (e.g., titanium silicide, tantalum silicide, tungsten silicide, nickel silicide, and cobalt silicide).

A gate contact GC, which is electrically connected to the gate electrode GE, may be provided to penetrate the second interlayer insulating layer 120 and the gate capping pattern GP. Referring to FIG. 2B, an upper region of each of the active contacts AC adjacent to the gate contact GC may be filled with an upper insulating pattern UIP. Accordingly, it may be possible to prevent or reduce the occurrence of a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of, or include, at least one metal of aluminum, copper, tungsten, molybdenum, or cobalt. The barrier pattern BM may be provided to cover side and bottom surfaces of the conductive pattern FM. In some example embodiments, the barrier pattern BM may include a metal layer and a metal nitride layer. The metal layer may be formed of, or include, at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first lower interconnection lines M1_R, second lower interconnection lines M1_I, and lower vias VI1. The lower vias VI1 may be provided below the first and second lower interconnection lines M1_R and M1_I.

Each of the first lower interconnection lines M1_R may be extended in the second direction D2 to cross the logic cell LC. Each of the first lower interconnection lines M1_R may be a power line. For example, a drain voltage VDD or a source voltage VSS may be applied to the first lower interconnection line M1_R.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line M1_R, to which the drain voltage VDD (e.g., a power voltage) is applied, may be disposed on the first cell boundary CB1. The first lower interconnection line M1_R, to which the drain voltage VDD is applied, may be extended along the first cell boundary CB1 and in the second direction D2. The first lower interconnection line M1_R, to which the source voltage VSS (e.g., a ground voltage) is applied, may be disposed on the second cell boundary CB2. The first lower interconnection line M1_R, to which the source voltage VSS is applied, may be extended along the second cell boundary CB2 and in the second direction D2.

The second lower interconnection lines M1_I may be disposed between the first lower interconnection lines M1_R, to which the drain voltage VDD and the source voltage VSS are respectively applied, in the first direction D1. Each of the second lower interconnection lines M1_I may be a line- or bar-shaped pattern extending in the second direction D2. The second lower interconnection lines M1_I may be arranged to be spaced apart from each other with a second pitch P2 in the first direction D1. The second pitch P2 may be smaller than the first pitch P1.

The lower vias VI1 may be provided below the first and second lower interconnection lines M1_R and M1_I of the first metal layer M1. The lower vias VI1 may be respectively interposed between the active contacts AC and the first and second lower interconnection lines M1_R and M1_I. The lower vias VI1 may be respectively interposed between the gate contacts GC and the second lower interconnection lines M1_I.

The lower interconnection line M1_R or M1_I of the first metal layer M1 and the lower via VI1 thereunder may be formed by separate processes. In other words, each of the lower interconnection line M1_R or M1_I and the lower via VI1 may be a single damascene process. The semiconductor device according to some example embodiments may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line- or bar-shaped pattern extending in the first direction D1. In other words, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch in the second direction D2. The third pitch may be smaller than the first pitch P1. The third pitch may be larger than the second pitch P2.

The second metal layer M2 may further include upper vias VI2. The upper vias VI2 may be provided below the upper interconnection lines M2_I. The upper vias VI2 may be respectively interposed between the lower interconnection lines M1_R and M1_I and the upper interconnection lines M2_I.

The upper interconnection line M2_I of the second metal layer M2 and the upper via VI2 thereunder may be formed by the same process and may form a single object. In other words, the upper interconnection line M2_I of the second metal layer M2 and the upper via VI2 may be formed by a dual damascene process.

The lower interconnection lines M1_R and M1_I of the first metal layer M1 and the upper interconnection lines M2_I of the second metal layer M2 may be formed of, or include, the same material or different conductive materials. For example, the lower interconnection lines M1_R and M1_I and the upper interconnection lines M2_I may be formed of, or include, at least one of metallic materials (e.g., aluminum, copper, tungsten, molybdenum, or cobalt).

In some example embodiments, although not shown, additional metal layers (e.g., M3, M4, M5, and so forth) may be further stacked on the fourth interlayer insulating layer 140. Each of the stacked metal layers may include routing lines.

Figure 2C:
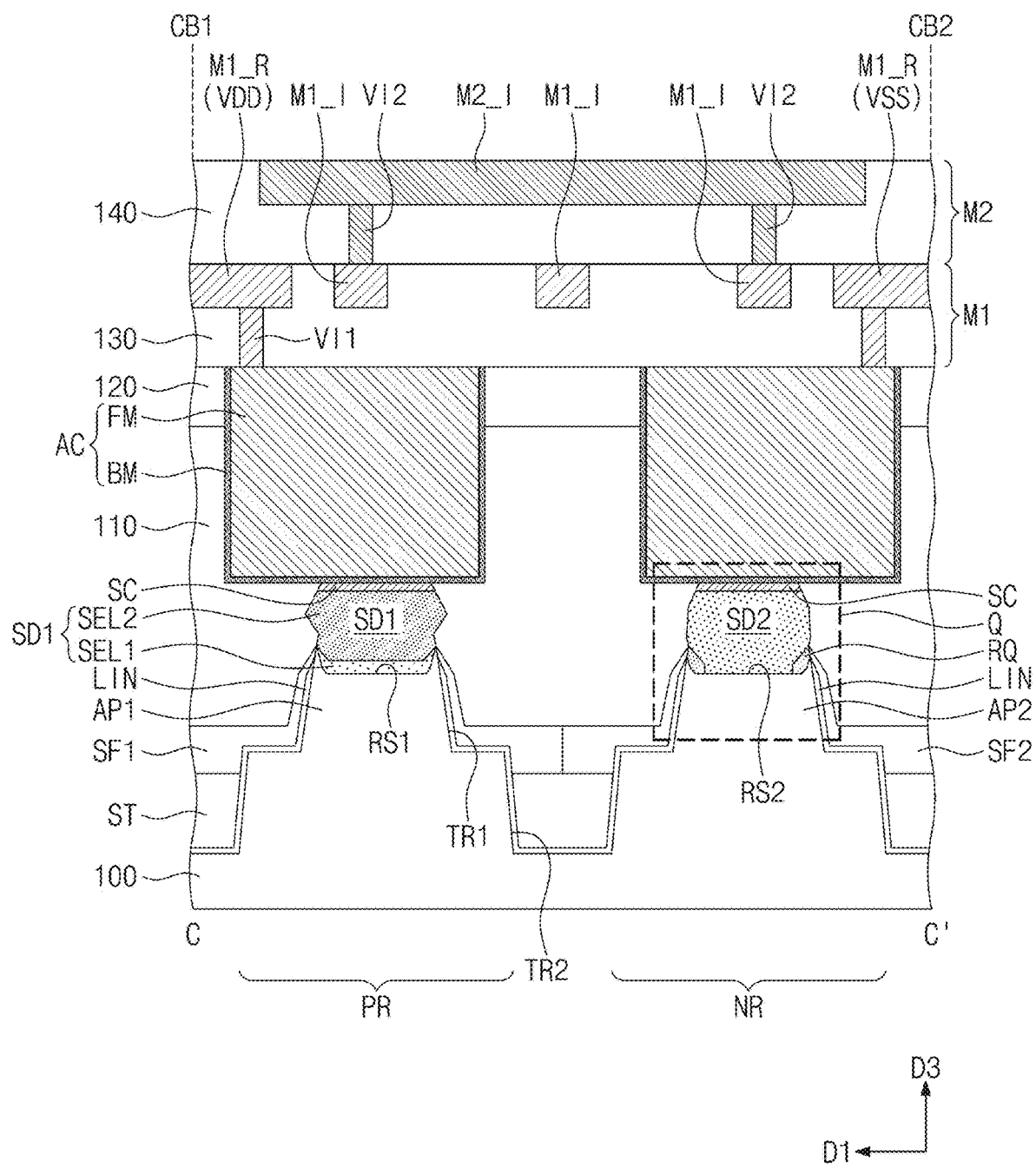
Figure 2D:
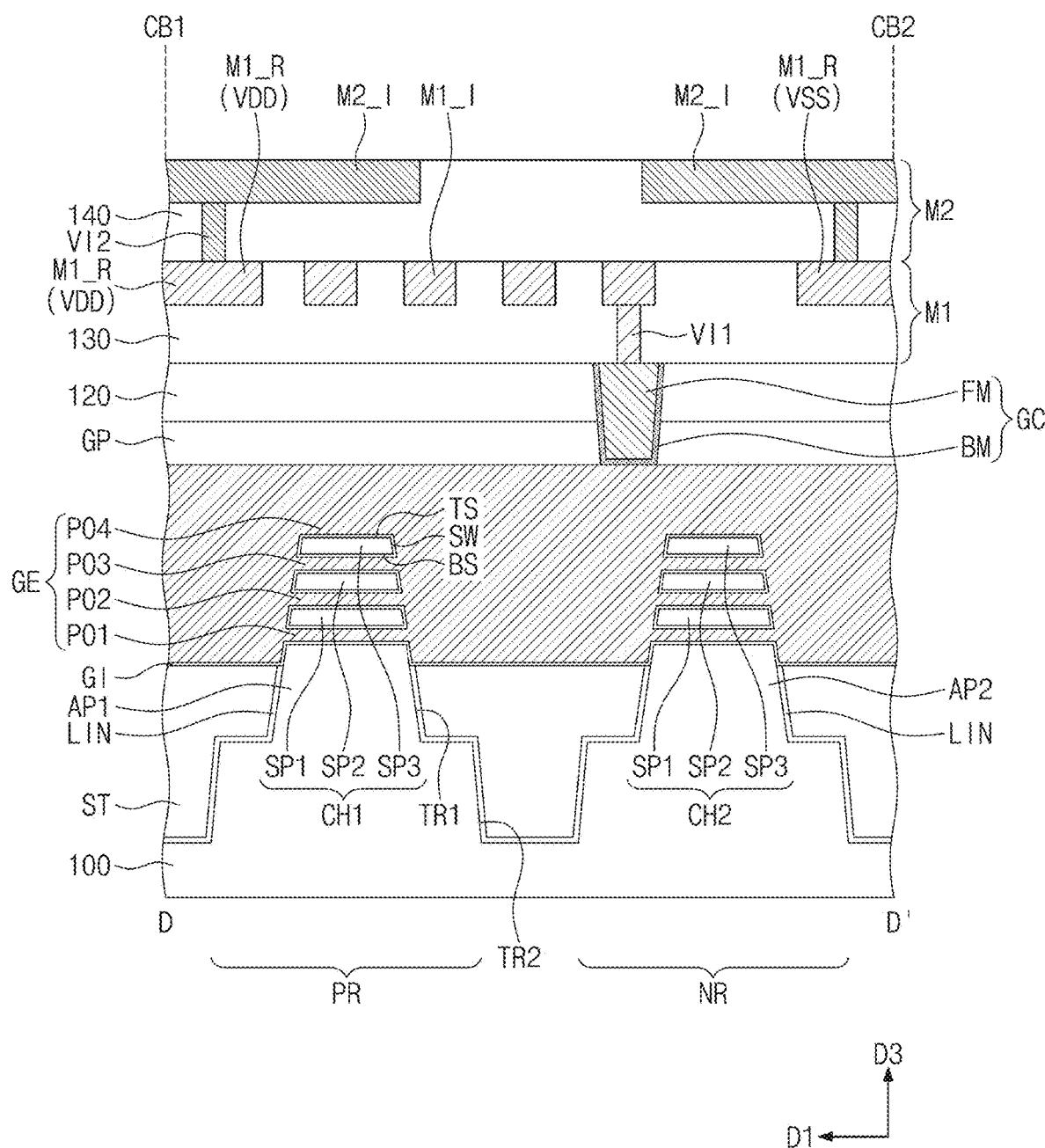
Figure 3A:
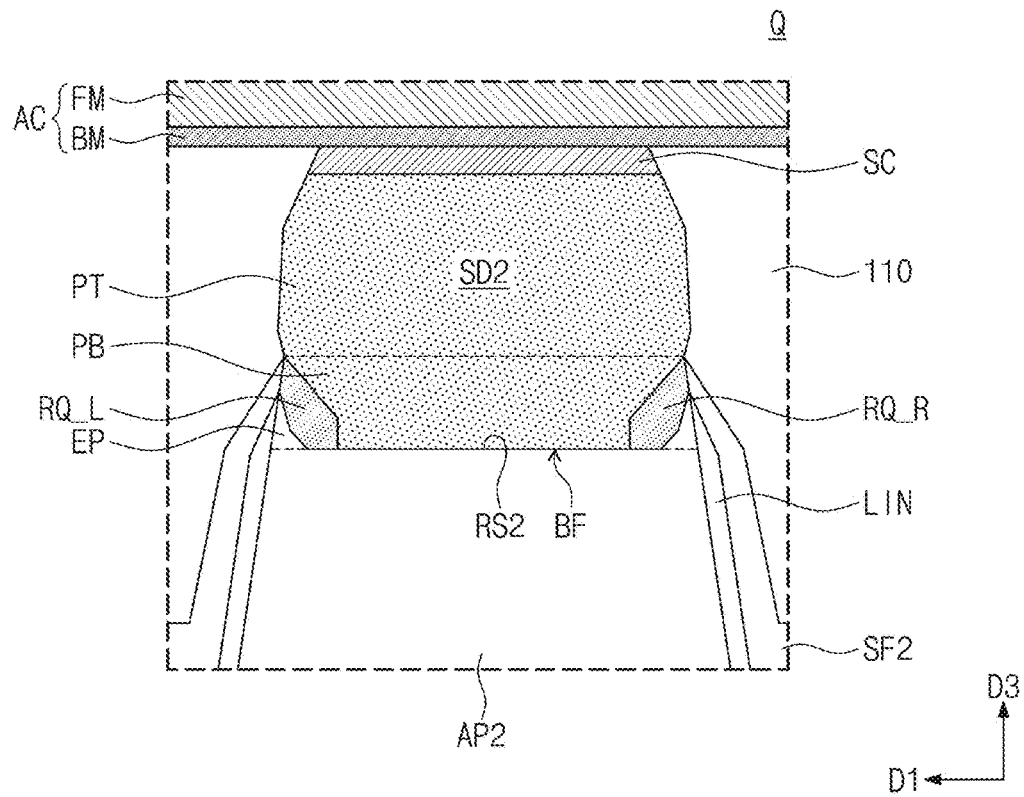
FIGS. 3A and 3B are enlarged sectional views illustrating a portion Q of FIG. 2C.
Figure 3B:
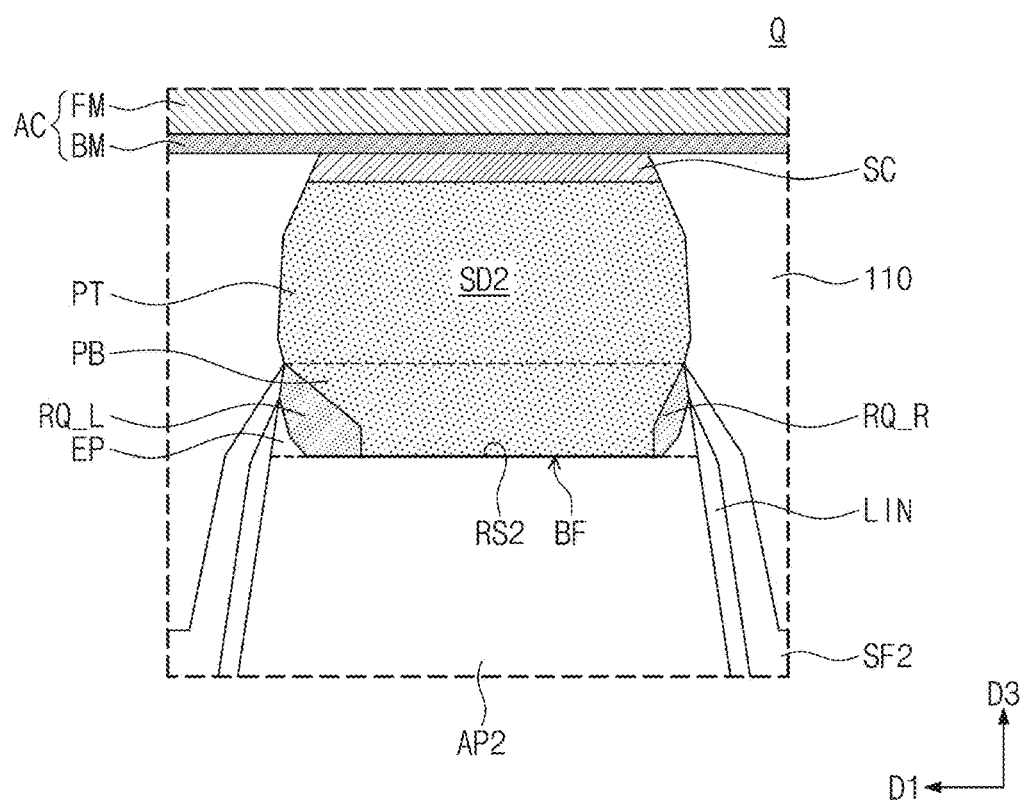
Figure 3C:
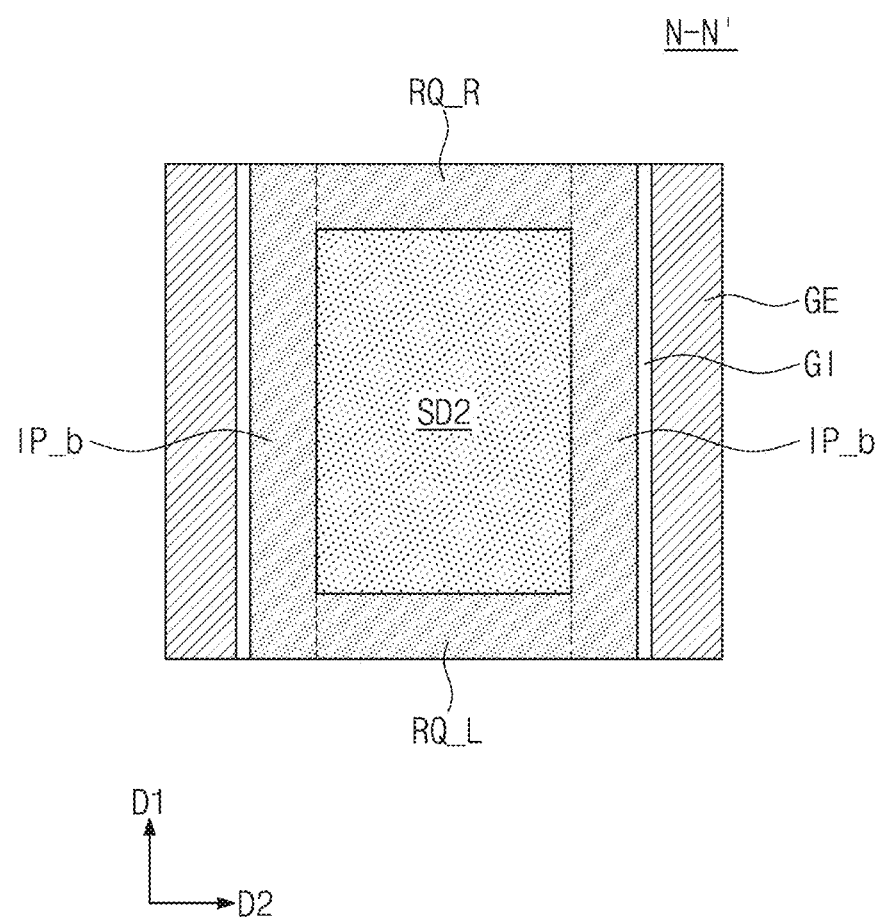
FIG. 3C is an enlarged plan view, which is taken at a level of a line N-N' of FIG. 2B.

Referring to FIG. 2C, first and second fence insulating layers SF1 and SF2 may be provided to cover the liner insulating layer LIN exposed by the device isolation layer ST. The first fence insulating layer SF1 may cover a side surface of the first active pattern AP1, and the second fence insulating layer SF2 may cover a side surface of the second active pattern AP2. The fence insulating layers SF1 and SF2 may have bottom surfaces that are placed in the second trench TR2 and are in contact with the device isolation layer ST. Each of the first and second fence insulating layers SF1 and SF2 may be formed of, or include, at least one of SiOCN, SiON, or SiCN. As an example, each of the first and second fence insulating layers SF1 and SF2 may be an amorphous insulating layer.

A region, which is adjacent to the first and second source/drain patterns SD1 and SD2, will be described in more detail with reference to FIGS. 2C, 3A, 3B, and 3C.

The first source/drain pattern SD1 and the second source/drain pattern SD2 may be provided in the first recess RS1 and the second recess RS2, respectively. Referring to the second source/drain pattern SD2, a lower portion PB of the second source/drain pattern SD2 may be provided in the second recess RS2.

A bottom surface of each of the first and second recesses RS1 and RS2 may be lower than the topmost portion of a corresponding one of the first and second active patterns AP1 and AP2. In other words, the first and second active patterns AP1 and AP2 may include edge portions EP protruding above the bottom surfaces of the first and second recesses RS1 and RS2. The edge portions EP may protrude along the liner insulating layer LIN or in the third direction D3. The liner insulating layer LIN may cover side surfaces of the edge portions EP. As an example, the topmost portion of the liner insulating layer LIN may be located at substantially the same level as the topmost portion of the edge portions EP. The first and second fence insulating layers SF1 and SF2 may protrude in the third direction D3, compared with the liner insulating layer LIN.

The second source/drain pattern SD2 may include a bottom surface BF in contact with the second active pattern AP2. A pair of middle insulating patterns RQ may be provided at both sides of the bottom surface BF of the second source/drain pattern SD2. In other words, the pair of the middle insulating patterns RQ may be spaced apart from each other with the bottom surface BF of the second source/drain pattern SD2 interposed therebetween. At least a portion of the middle insulating pattern RQ may be disposed in the second recess RS2.

Each of the pair of the middle insulating patterns RQ may be provided between the second active pattern AP2 and the second source/drain pattern SD2 and may be in contact with an inner side surface of the second fence insulating layer SF2. In other words, each of the pair of the middle insulating patterns RQ may occupy a space, which is defined by a top surface of the second active pattern AP2, a side surface of the lower portion PB of the second source/drain pattern SD2, and an inner side surface of the second fence insulating layer SF2. In some example embodiments, each of the pair of the middle insulating patterns RQ may be in contact with an inner side surface of the edge portion EP adjacent thereto. In the case where the liner insulating layer LIN is provided, each of the middle insulating patterns RQ may be connected to an upper portion of the liner insulating layer LIN.

An upper portion PT of the second source/drain pattern SD2 may be extended onto each of the pair of the middle insulating patterns RQ to cover the pair of the middle insulating patterns RQ. Not only the pair of the middle insulating patterns RQ but also the bottom surface BF of the second source/drain pattern SD2 may be provided to cover the second active pattern AP2. The pair of the middle insulating patterns RQ may be provided below one of the second source/drain patterns SD2. In some example embodiments, in a sectional view taken in the first direction D1 that is an extension direction of the gate electrode GE, the pair of the middle insulating patterns RQ may cover about 10% to about 30% of the top surface of the second active pattern AP2. A contact area between the second source/drain pattern SD2 and the second active pattern AP2 may be reduced by the pair of the middle insulating patterns RQ, and thus, a leakage current between adjacent ones of the second source/drain patterns SD2 may be reduced.

An NMOSFET transistor provided on the NMOSFET region may have a high doping concentration or contain impurities having a long diffusion length, compared with a PMOSFET transistor. As a result, a bottom leakage current, which is leaked through an upper portion of the second active pattern AP2 below the second source/drain patterns SD2, may be increased. According to example embodiments of the inventive concepts, such a bottom leakage current may be reduced by the middle insulating patterns RQ, and thus, an operation property of a semiconductor device may be improved. In addition, since the middle insulating patterns RQ does not cover the entire top surface of the second active pattern AP2, the second source/drain pattern SD2 may be directly connected to the second active pattern AP2, and thus, it may be possible to epitaxially grow the second source/drain pattern SD2 from the second active pattern AP2 without substantial difficulty.

The middle insulating patterns RQ may be locally provided within a confined region (e.g., on the NMOSFET region NR) and may not be provided on the PMOSFET region PR. That is, the middle insulating patterns RQ may not be provided between the first active pattern AP1 and the first source/drain pattern SD1. In other words, a side surface of a lower portion of the first source/drain pattern SD1 may be in contact with the first active pattern AP1 and the first fence insulating layer SF1. As a result, a first contact area between the first active pattern AP1 and the first source/drain pattern SD1 may be larger than a second contact area between the second active pattern AP2 and the second source/drain pattern SD2.

The middle insulating patterns RQ and the inner spacers IP may be formed by the same process and may include substantially the same material. In some example embodiments, the middle insulating patterns RQ and the inner spacers IP may include one of SiN, SiCN, or SiOCN. The middle insulating patterns RQ and the inner spacers IP may be a crystalline insulating layer. The middle insulating patterns RQ and the inner spacers IP may be formed of, or include, a different material from the second fence insulating layer SF2. In other words, the middle insulating patterns RQ and the inner spacers IP may be formed of, or include, one of SiN, SiCN, or SiOCN, and the second fence insulating layer SF2 may be formed of, or include, another of SiN, SiCN, or SiOCN. As an example, the middle insulating patterns RQ and the inner spacers IP may be formed of, or include, SiN, and the second fence insulating layer SF2 may be formed of, or include, SiOCN.

As an example, the inner spacers IP may be spaced apart from each other, in the third direction D3, with the first and second semiconductor patterns SP1 and SP2 interposed therebetween. The middle insulating patterns RQ may be disposed at the same level as the lowermost one IP_b of the inner spacers IP. As shown in FIGS. 3A to 3C, the pair of the middle insulating patterns RQ may include a first middle insulating pattern RQ_R and a second middle insulating pattern RQ_L. The first and second middle insulating patterns RQ_R and RQ_L may have a symmetric or same shape, as shown in FIG. 3A, but in some example embodiments, one of the first and second middle insulating patterns RQ_R and RQ_L may be larger than or different from the other, as shown in FIG. 3B.

As shown in FIG. 3C, each of the pair of the middle insulating patterns RQ may connect a pair of the lowermost inner spacers IP_b, which are spaced apart from each other with the second source/drain pattern SD2 interposed therebetween, to each other. As a result, the second source/drain pattern SD2 may be enclosed by the pair of the lowermost inner spacers IP_b and the pair of the middle insulating patterns RQ, when viewed in a plan view. Alternatively, at least a portion of the middle insulating patterns RQ may not be connected to the lowermost inner spacers IP_b.

FIGS. 4A to 14D are sectional views illustrating a method of fabricating a semiconductor device, according to example embodiments of the inventive concepts. In detail, FIGS. 4A, 5A, 6A, 7A, 8A, 12A, 13A, and 14A are sectional views corresponding to the line A-A' of FIG. 1. FIGS. 9A, 10A, 11A, 12B, 13B, and 14B 14A are sectional views corresponding to the line B-B' of FIG. 1. FIGS. 7B, 8B, 9B, 11B, 12C, and 14C are sectional views corresponding to the line C-C' of FIG. 1. FIGS. 4B, 5B, 6B, 7C, 12D, 13C, and 14D are sectional views corresponding to the line D-D' of FIG. 1.

Figure 4A:
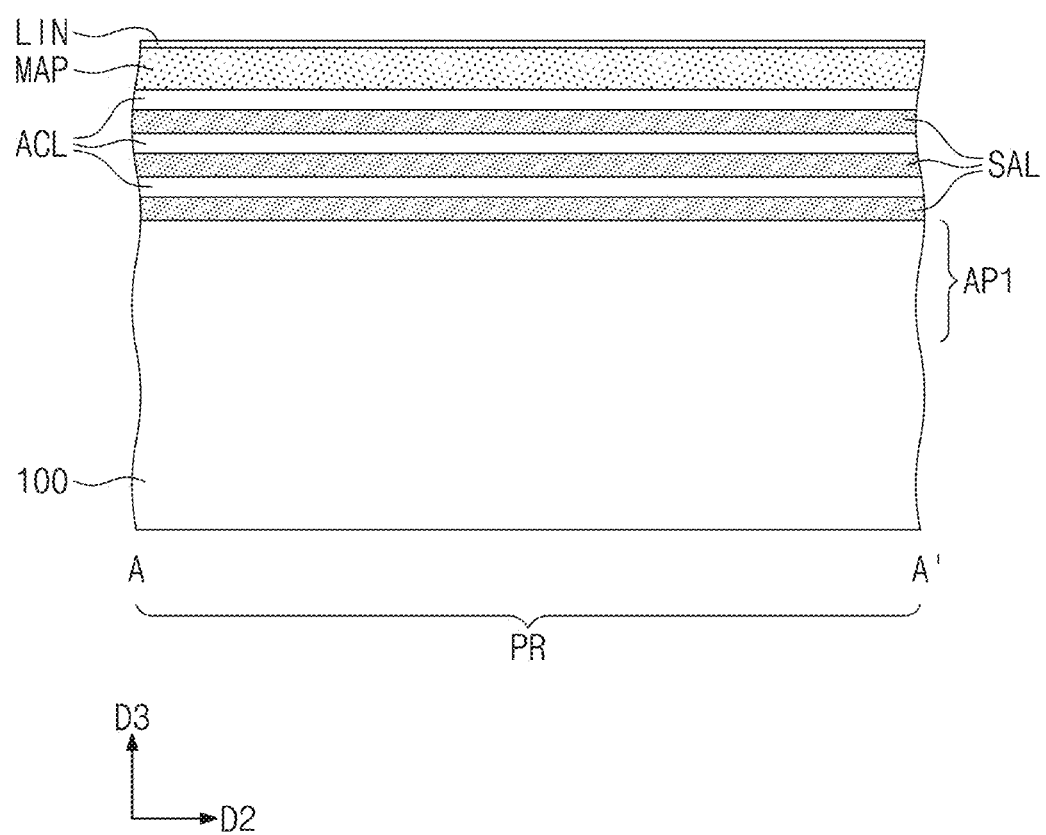
FIGS. 4A to 14D are sectional views illustrating a method of fabricating a semiconductor device, according to example embodiments of the inventive concepts.
Figure 4B:
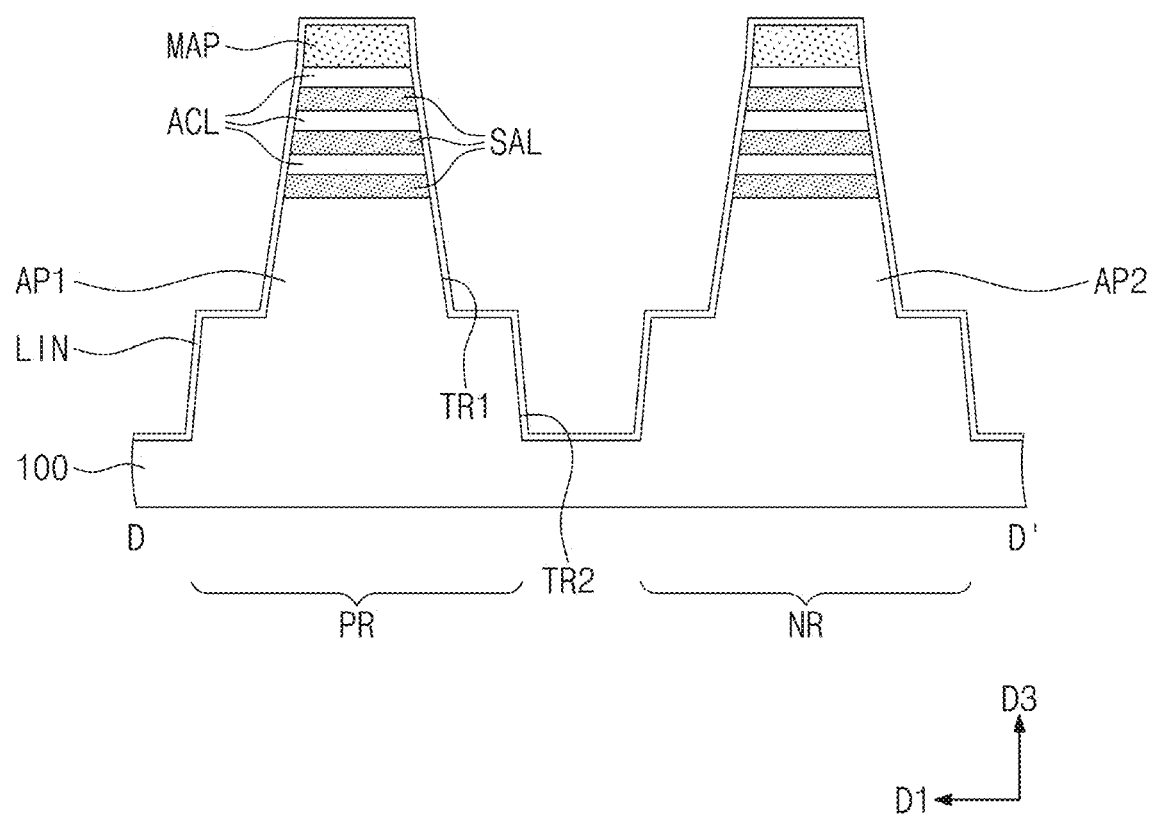

Referring to FIGS. 4A and 4B, a substrate 100 including a PMOSFET region PR and an NMOSFET region NR may be provided. Sacrificial layers SAL and active layers ACL, which are alternately stacked on the substrate 100, may be formed. The sacrificial layers SAL may be formed of, or include, at least one of silicon (Si), germanium (Ge), or silicon-germanium (SiGe), and the active layers ACL may be formed of, or include, at least one of silicon (Si), germanium (Ge), or silicon-germanium (SiGe).

For example, the sacrificial layers SAL may be formed of, or include, silicon-germanium (SiGe), and the active layers ACL may be formed of, or include, silicon (Si). A germanium concentration of each of the sacrificial layers SAL may range from about 10 at % to about 30 at %.

Mask patterns MAP may be respectively formed on the PMOSFET region PR and the NMOSFET region NR of the substrate 100. The mask patterns MAP may be a line- or bar-shaped pattern extending in a second direction D2.

A first patterning process, in which the mask patterns MAP are used as an etch mask, may be performed to form a first trench TR1 defining a first active pattern AP1 and a second active pattern AP2. The first active pattern AP1 and the second active pattern AP2 may be formed on the PMOSFET region PR and the NMOSFET region NR, respectively. Each of the first and second active patterns AP1 and AP2 may include the sacrificial layers SAL and the active layers ACL, which are alternately stacked in an upper portion thereof.

A second patterning process may be performed on the substrate 100 to form a second trench TR2 defining the PMOSFET region PR and the NMOSFET region NR. The second trench TR2 may be formed to be deeper than the first trench TR1. Thereafter, the liner insulating layer LIN may be formed on the substrate 100 to conformally cover the first and second trenches TR1 and TR2. In some example embodiments, the liner insulating layer LIN may be formed of, or include, SiN or SiON.

Figure 5A:
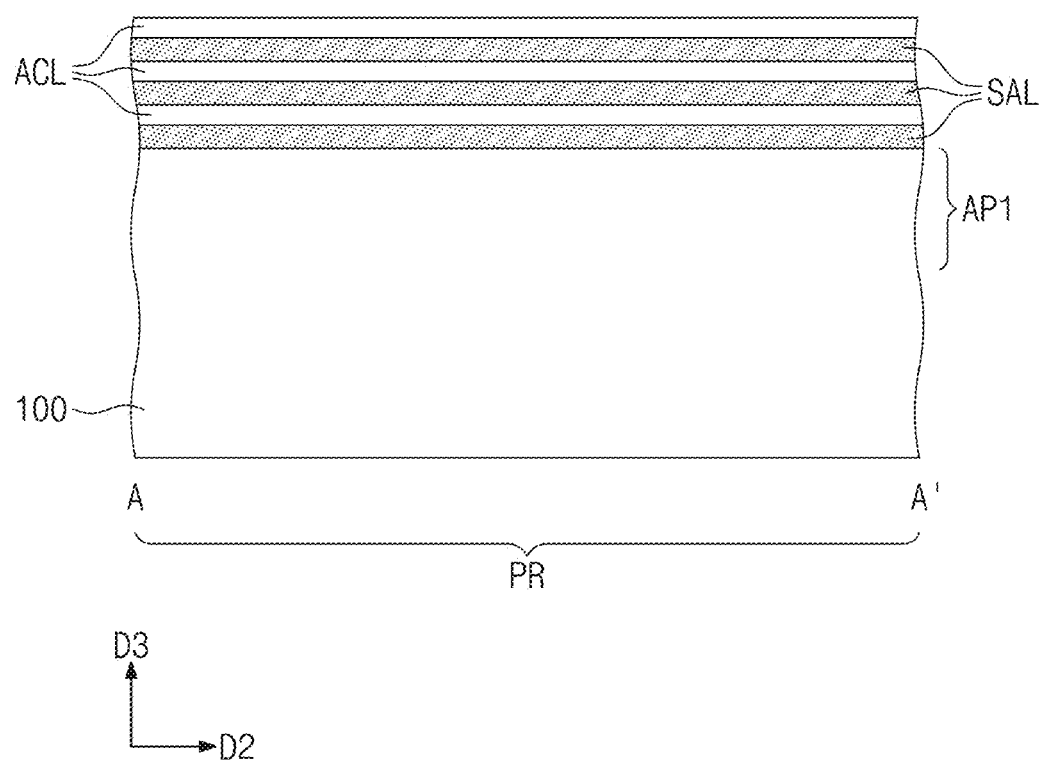
Figure 5B:
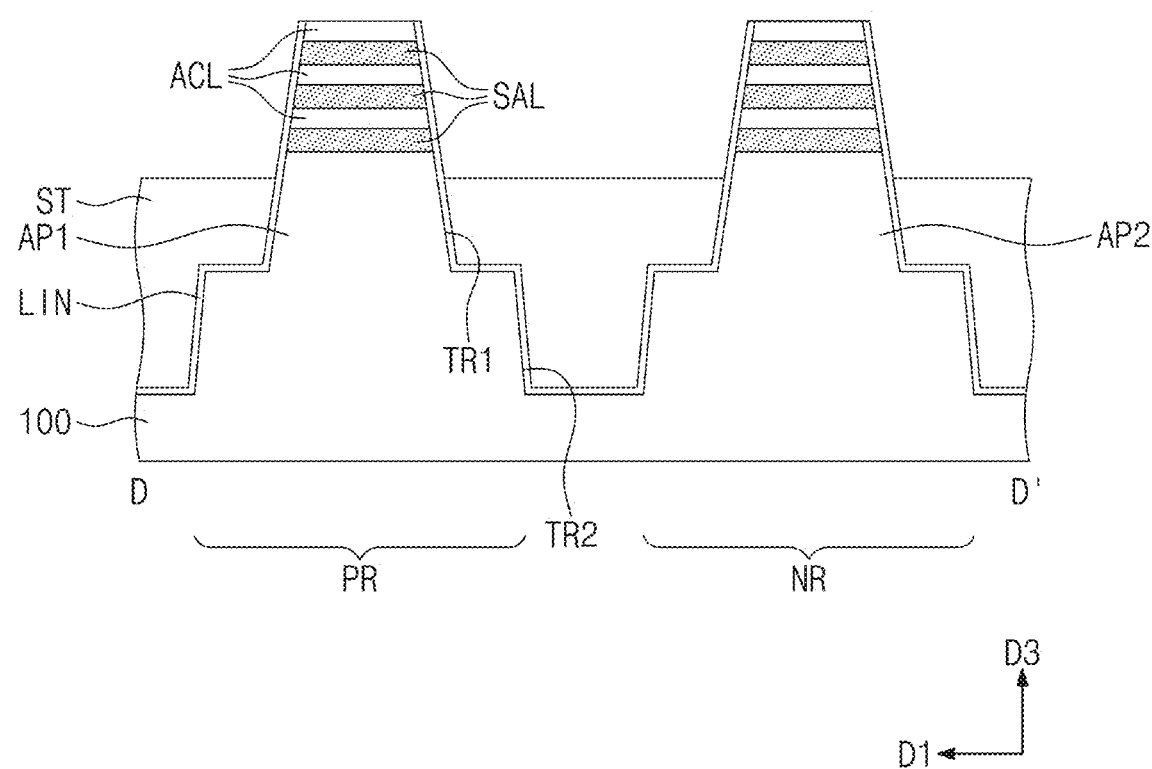

Referring to FIGS. 5A and 5B, a device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed.

The device isolation layer ST may be formed of, or include, an insulating material (e.g., silicon oxide). Each of the first and second active patterns AP1 and AP2 may include an upper portion protruding above the device isolation layer ST. For example, the upper portion of each of the first and second active patterns AP1 and AP2 may vertically protrude above the device isolation layer ST.

Figure 6A:
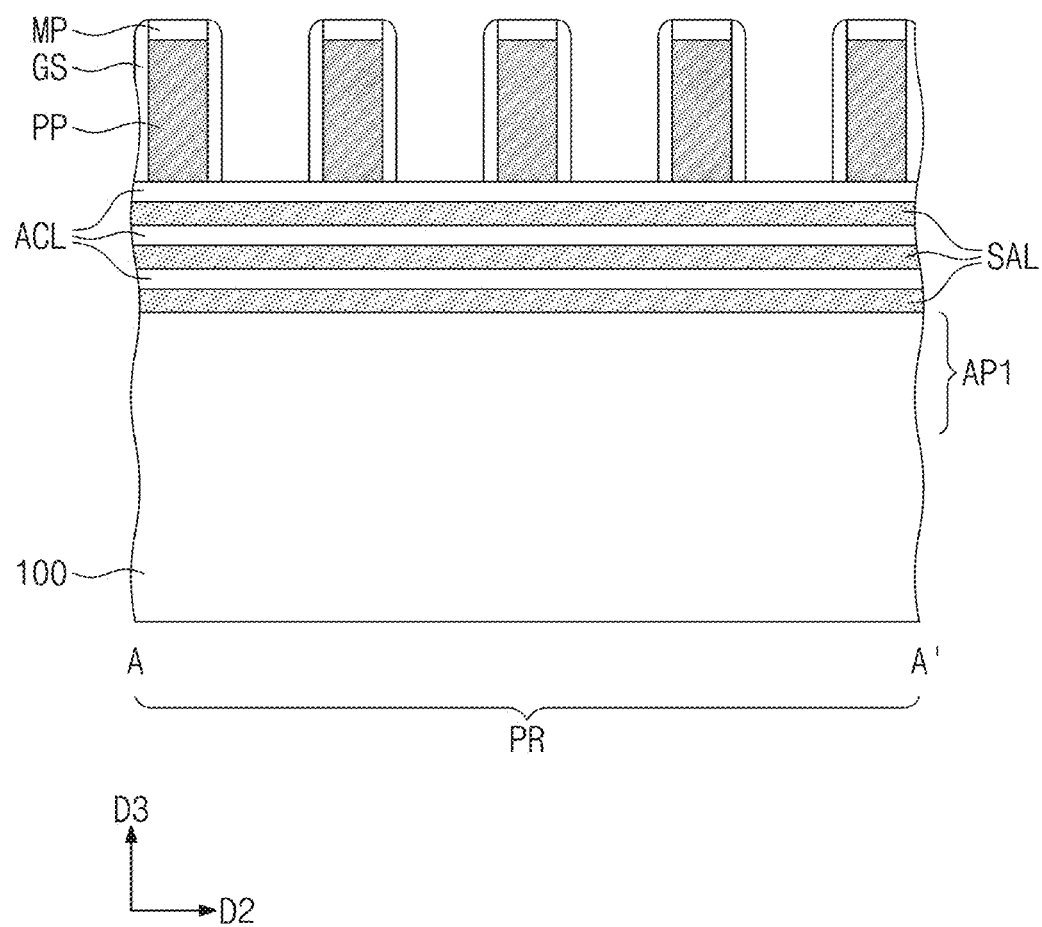
Figure 6B:
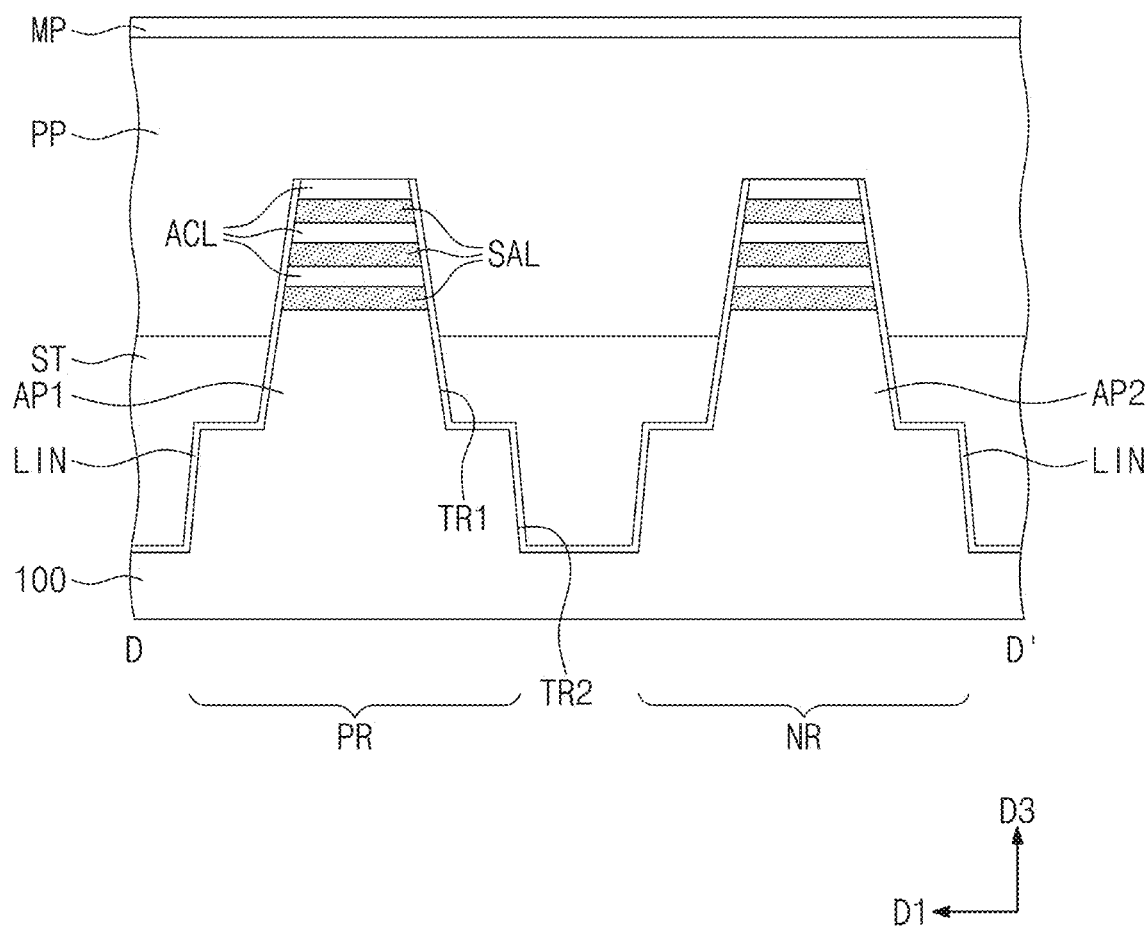

Referring to FIGS. 6A and 6B, sacrificial patterns PP may be formed on the substrate 100 to cross the first and second active patterns AP1 and AP2. Each of the sacrificial patterns PP may be a line- or bar-shaped pattern extending in the first direction D1. The sacrificial patterns PP may be arranged with a specific pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of, or include, poly silicon.

A pair of the gate spacers GS may be respectively formed on opposite side surfaces of the sacrificial patterns PP. The formation of the gate spacers GS may include conformally forming a gate spacer layer on the substrate 100 and anisotropically etching the gate spacer layer. The gate spacer layer may be formed of, or include, at least one of SiCN, SiCON, or SiN. In some example embodiments, the gate spacer layer may be a multi-layered structure including at least two of SiCN, SiCON, or SiN.

Figure 7A:
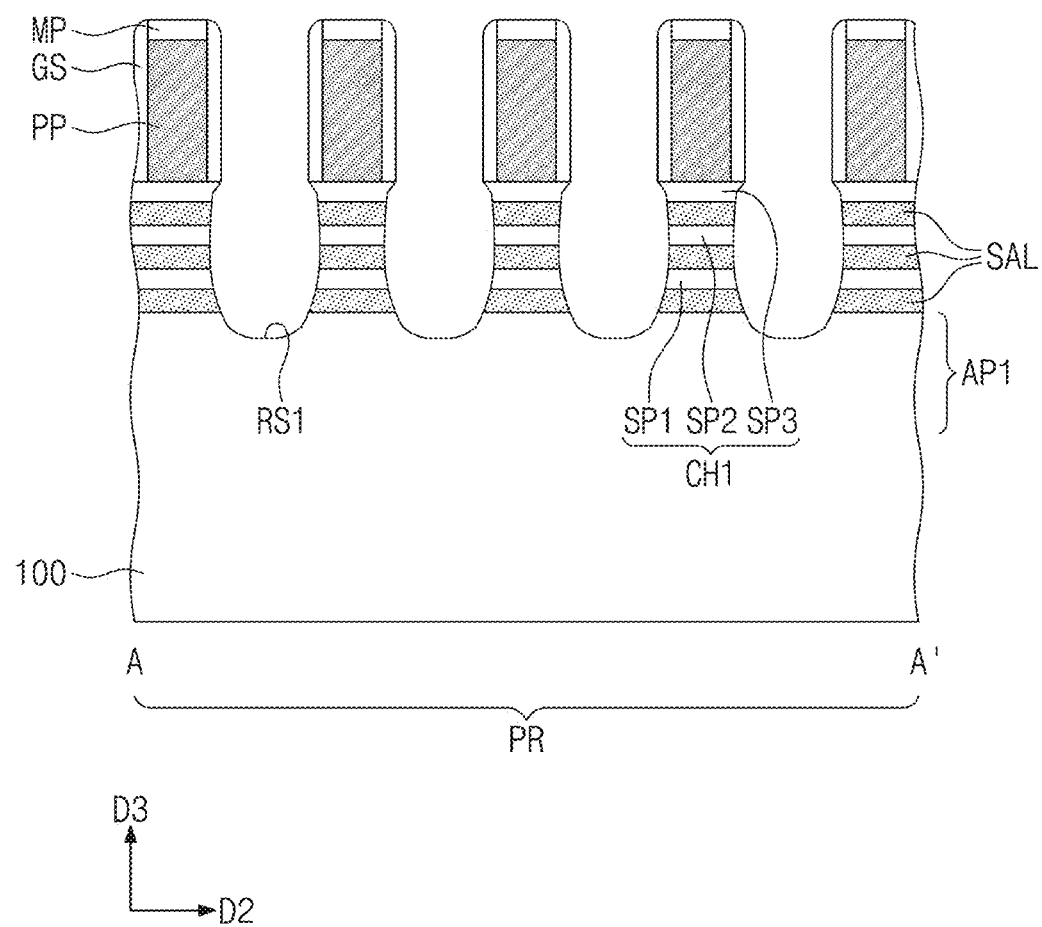
Figure 7B:
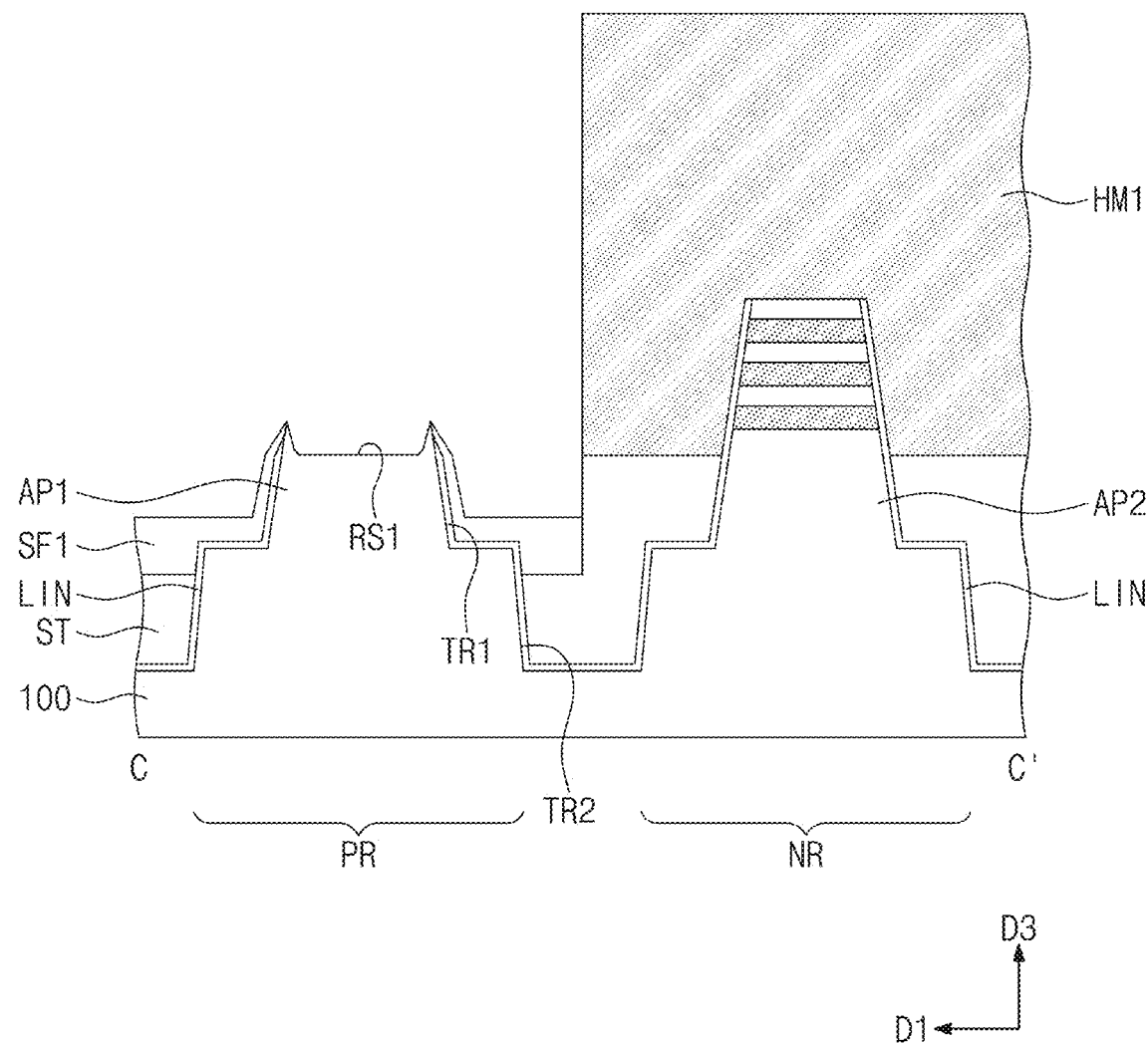
Figure 7C:
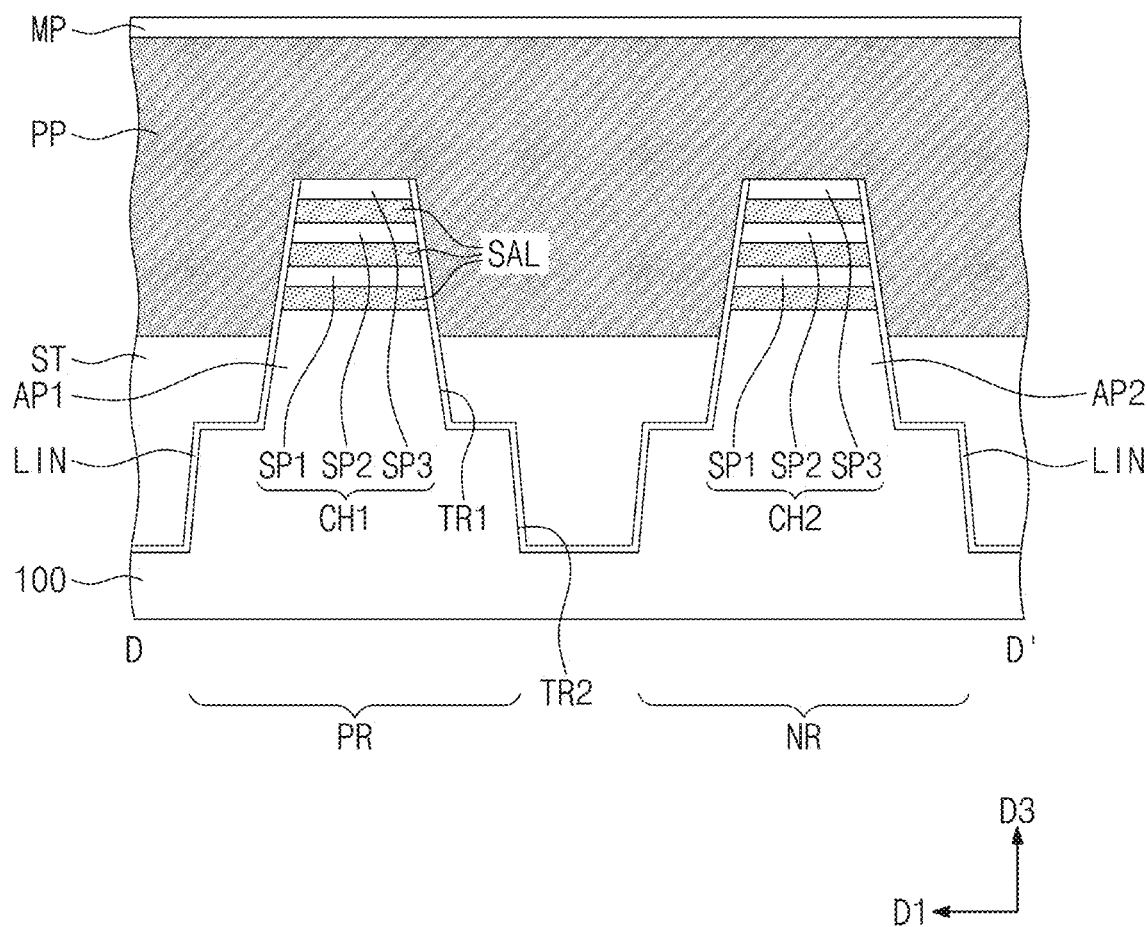

Referring to FIGS. 7A to 7C, a first mask pattern HM1 may be formed to cover the NMOSFET region NR, and then, the first recesses RS1 may be formed in an upper portion of the first active pattern AP1. During the formation of the first recesses RS1, the device isolation layer ST, which is positioned at both sides of each of the first active patterns AP1, may be partially recessed. In detail, the first recesses RS1 may be formed by etching the upper portion of the first active pattern AP1 using the hard mask patterns MP and the gate spacers GS as an etch mask. The first fence insulating layer SF1 may be formed to cover the PMOSFET region PR. The first fence insulating layer SF1 may be formed by forming an insulating layer to cover the PMOSFET region PR and then performing an etching process to expose the first recesses RS1. The first fence insulating layer SF1 may be formed of, or include, at least one of SiOCN, SiON, or SiCN.

Figure 8A:
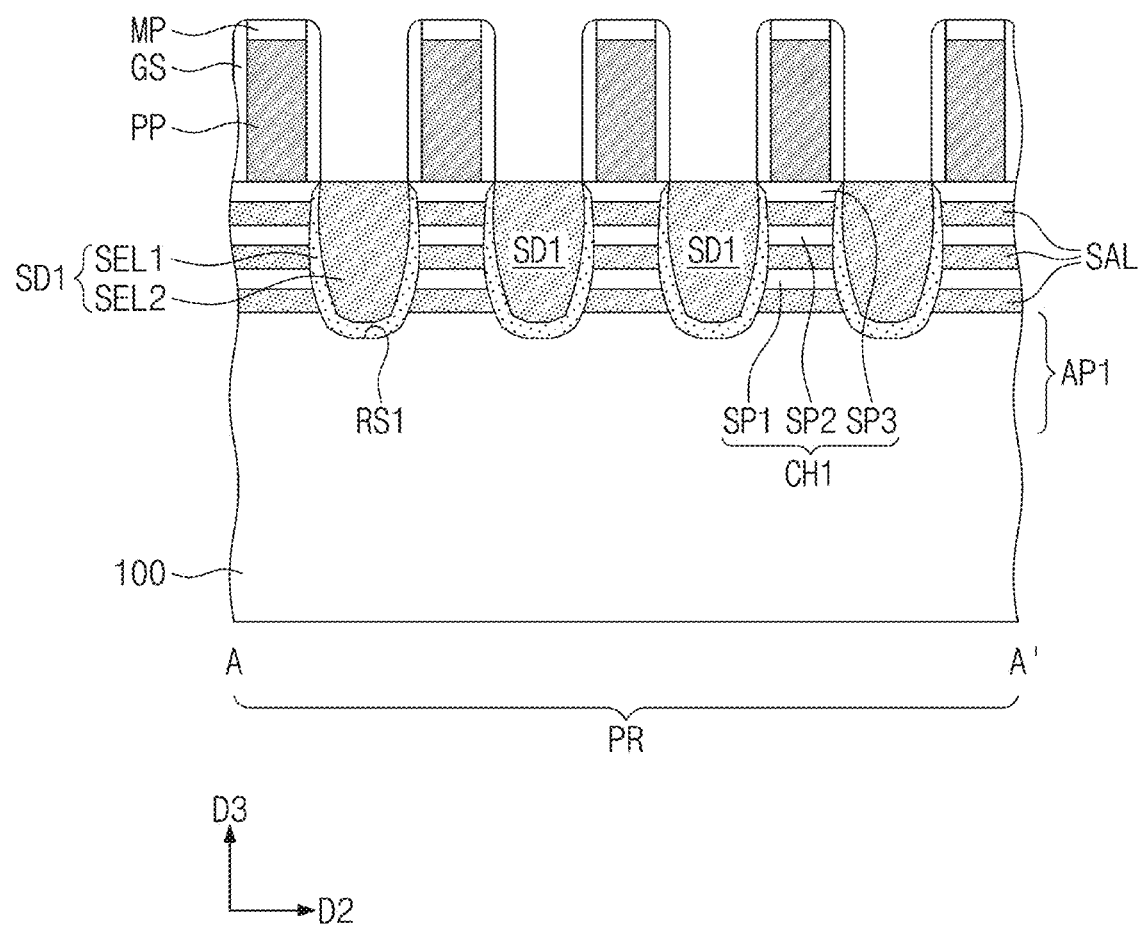
Figure 8B:
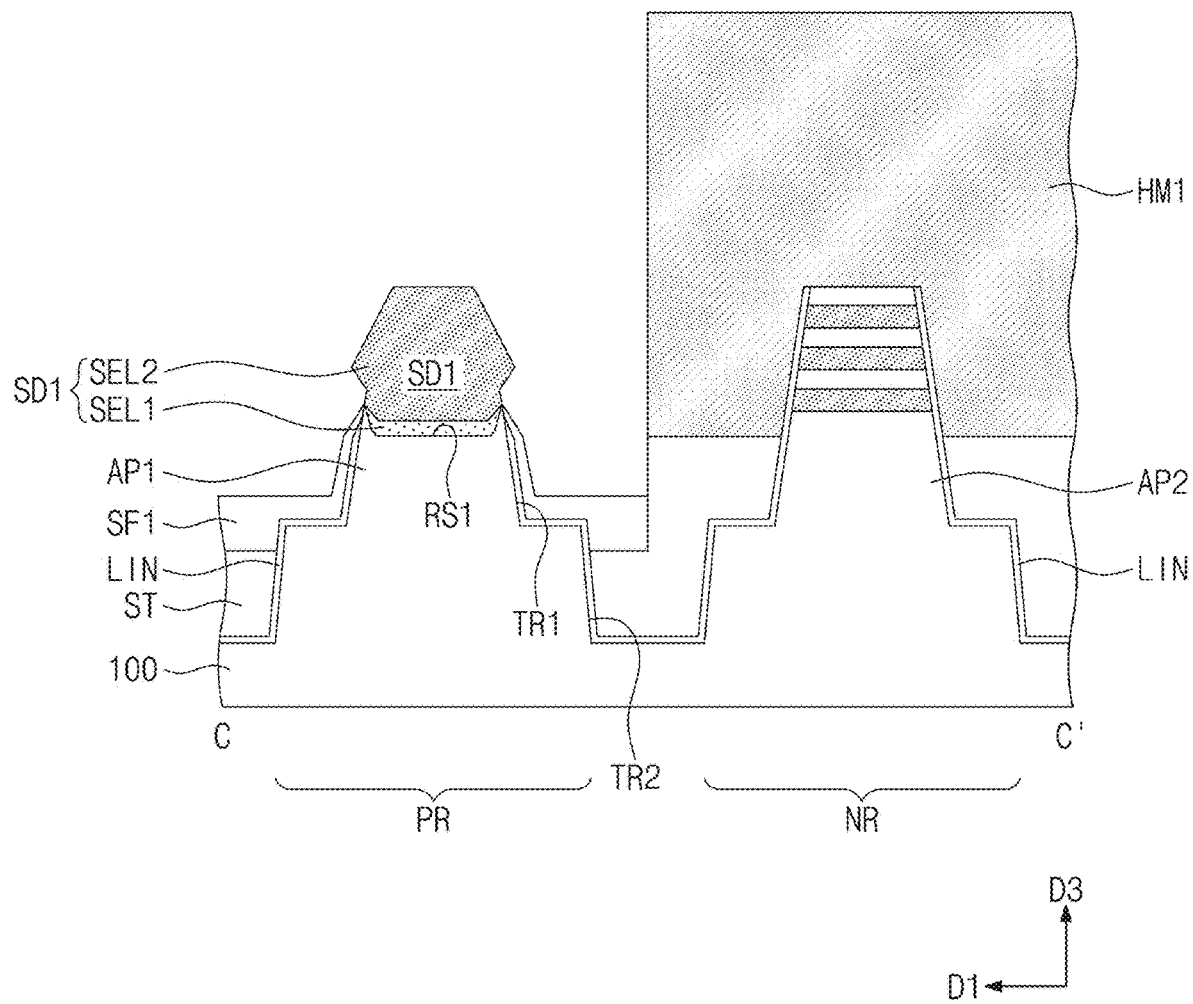

Referring to FIGS. 8A and 8B, first source/drain patterns SD1 may be formed in the first recesses RS1, respectively. Specifically, a first SEG process, in which an inner surface of the first recess RS1 is used as a seed layer, may be performed to form a first semiconductor layer SEL1. The first semiconductor layer SEL1 may be grown using first to third semiconductor patterns SP1, SP2, and SP3 and the substrate 100, which are exposed through the first recesses RS1, as a seed. As an example, the first SEG process may include a chemical vapor deposition (CVD) process or a molecular beam epitaxy (MBE) process.

The first semiconductor layer SEL1 may be formed of, or include, a semiconductor material (e.g., SiGe) having a lattice constant greater than that of the substrate 100. The first semiconductor layer SEL1 may be formed to have a relatively low germanium concentration. In some example embodiments, the first semiconductor layer SEL1 may be provided to contain only silicon (Si) and not germanium (Ge). The germanium concentration of the first semiconductor layer SEL1 may range from about 0 at % to about 10 at %.

A second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high germanium concentration. As an example, the germanium concentration of the second semiconductor layer SEL2 may range from about 30 at % to about 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

Figure 9A:
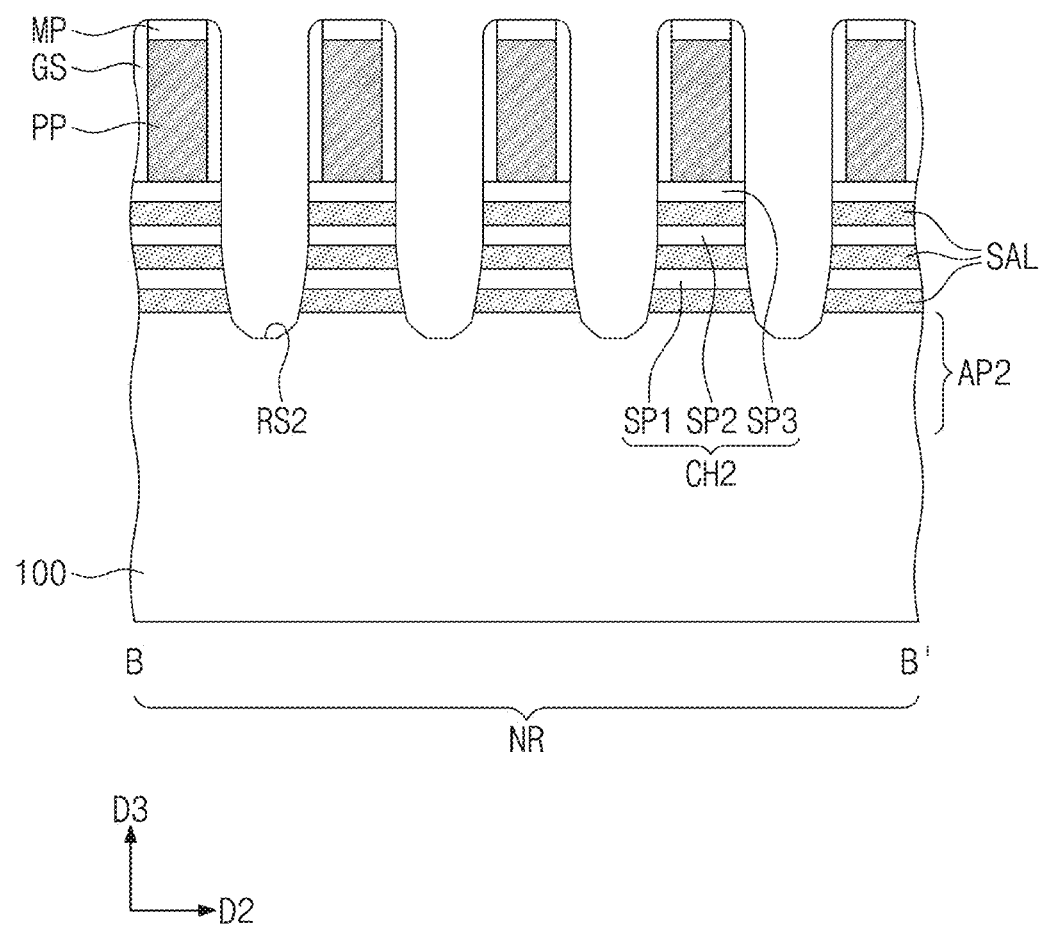
Figure 9B:
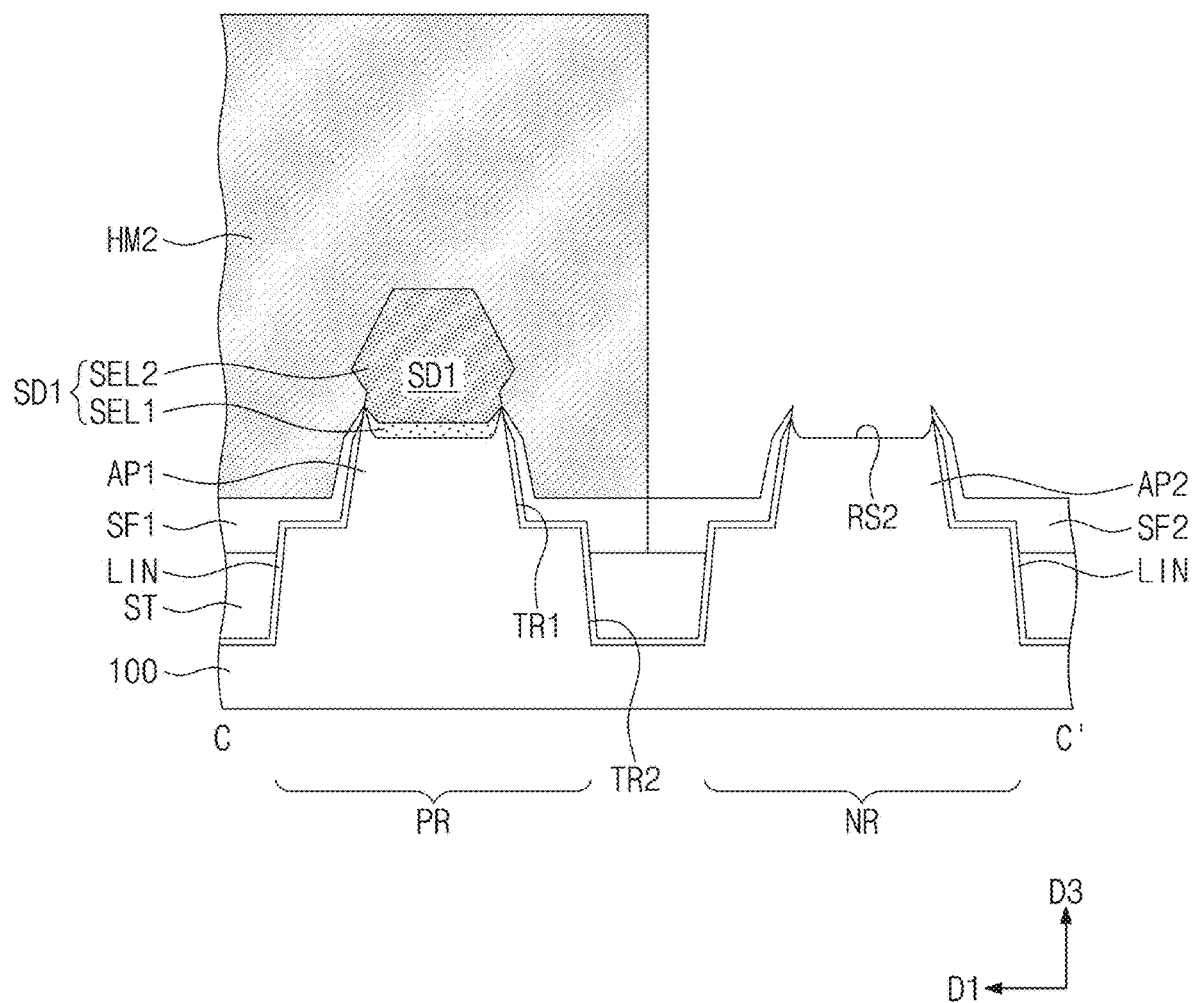

Referring to FIGS. 9A and 9B, the first mask pattern HM1 may be removed, a second mask pattern HM2 may be formed to cover the PMOSFET region PR, and the second recesses RS2 may be formed in an upper portion of the second active pattern AP2. During the formation of the second recesses RS2, the device isolation layer ST, which is positioned at both sides of each of the second active patterns AP2, may be partially recessed. The second fence insulating layer SF2 may be formed to cover the NMOSFET region NR. The second fence insulating layer SF2 may be formed by forming an insulating layer to cover the NMOSFET region NR and then performing an etching process to expose the second recesses RS2. The second fence insulating layer SF2 may be formed of, or include, at least one of SiOCN, SiON, or SiCN. In some example embodiments, the second fence insulating layer SF2 may be formed along with the first fence insulating layer SF1, during the process of forming the first fence insulating layer SF1 described with reference to FIGS. 7A and 7B. In some example embodiments, at least a portion of the first and second fence insulating layers SF1 and SF2 may be formed, along with the gate spacers GS, during the process of forming the gate spacers GS.

Figure 10A:
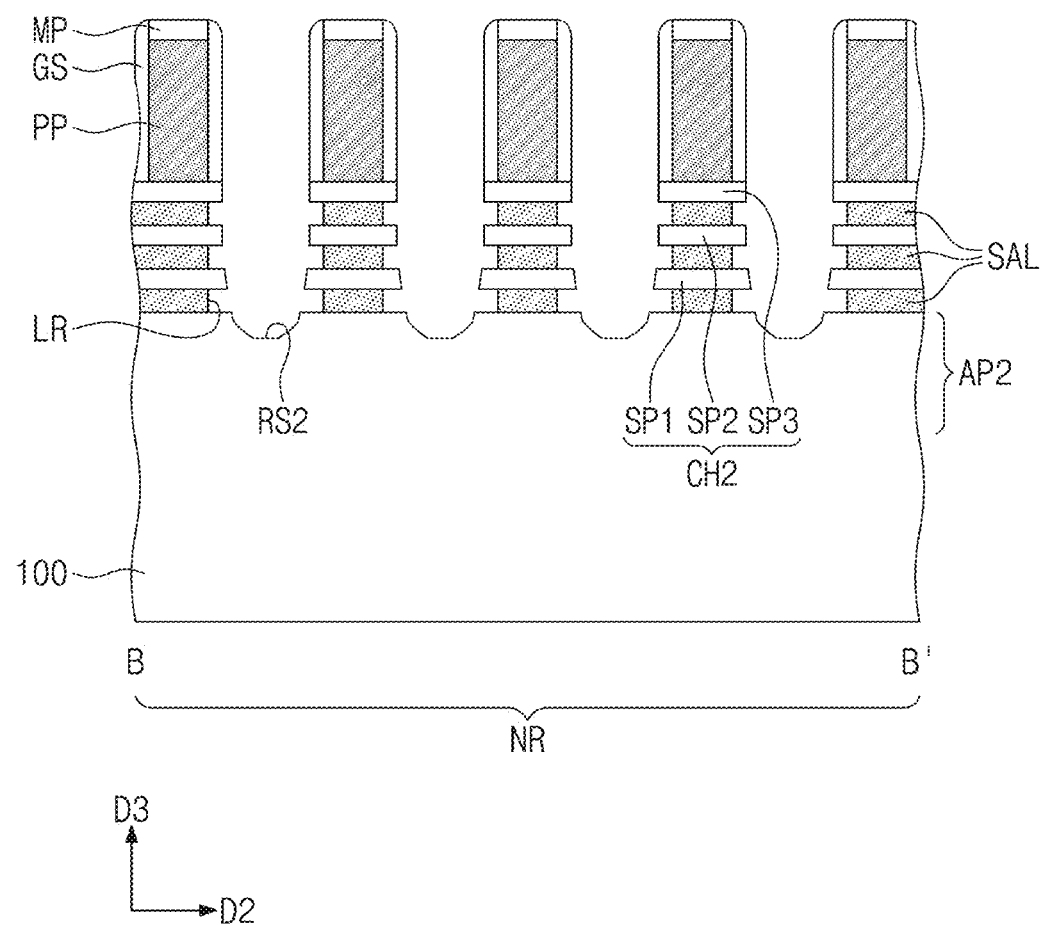
Figure 10B:
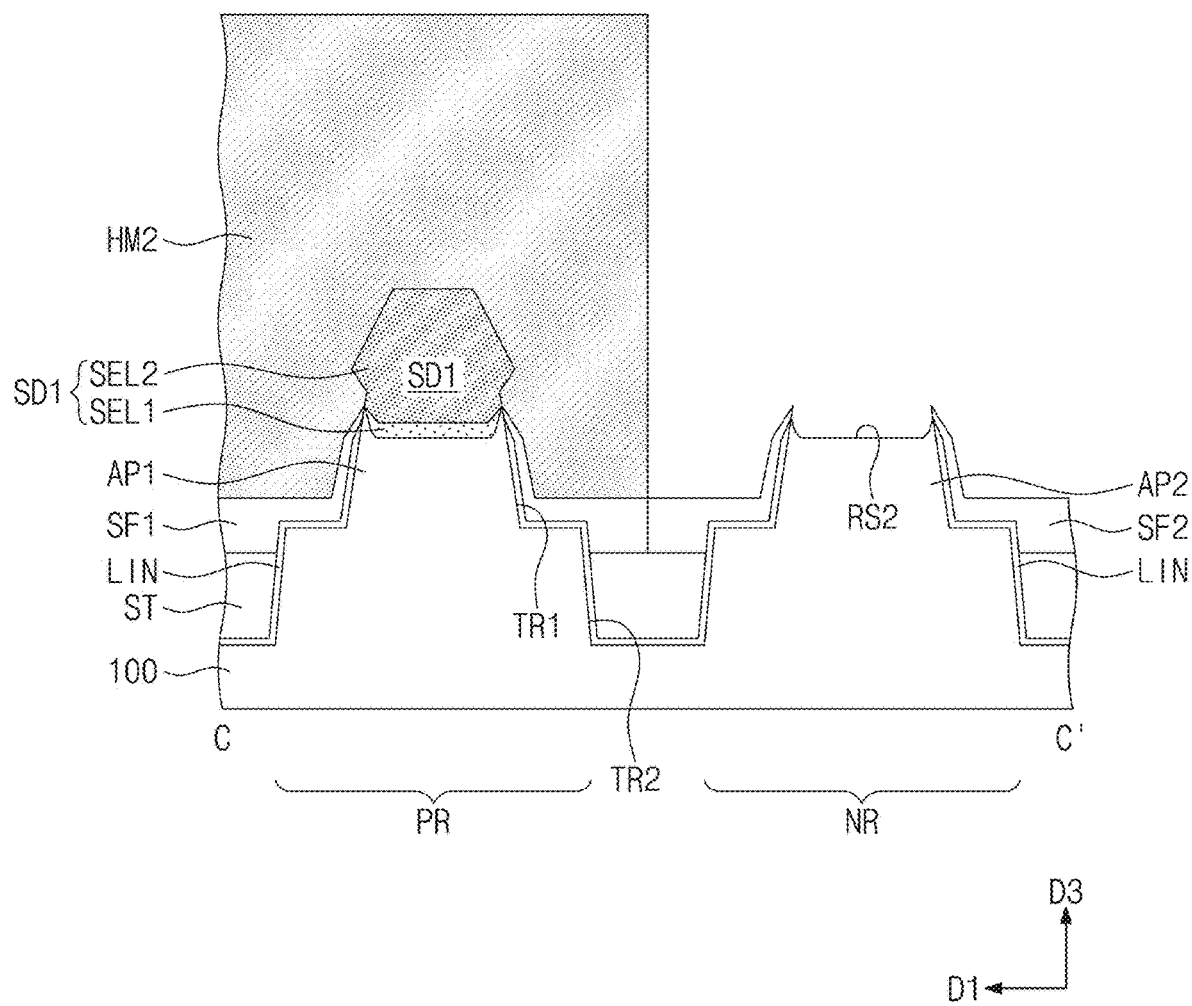

Referring to FIGS. 10A and 10B, the sacrificial layers SAL on the NMOSFET region NR may be selectively etched to form horizontal recesses LR, which are extended from the second recesses RS2. The formation of the horizontal recesses LR may be performed using an etchant, which is chosen to selectively etch the sacrificial layers SAL.

Figure 11A:
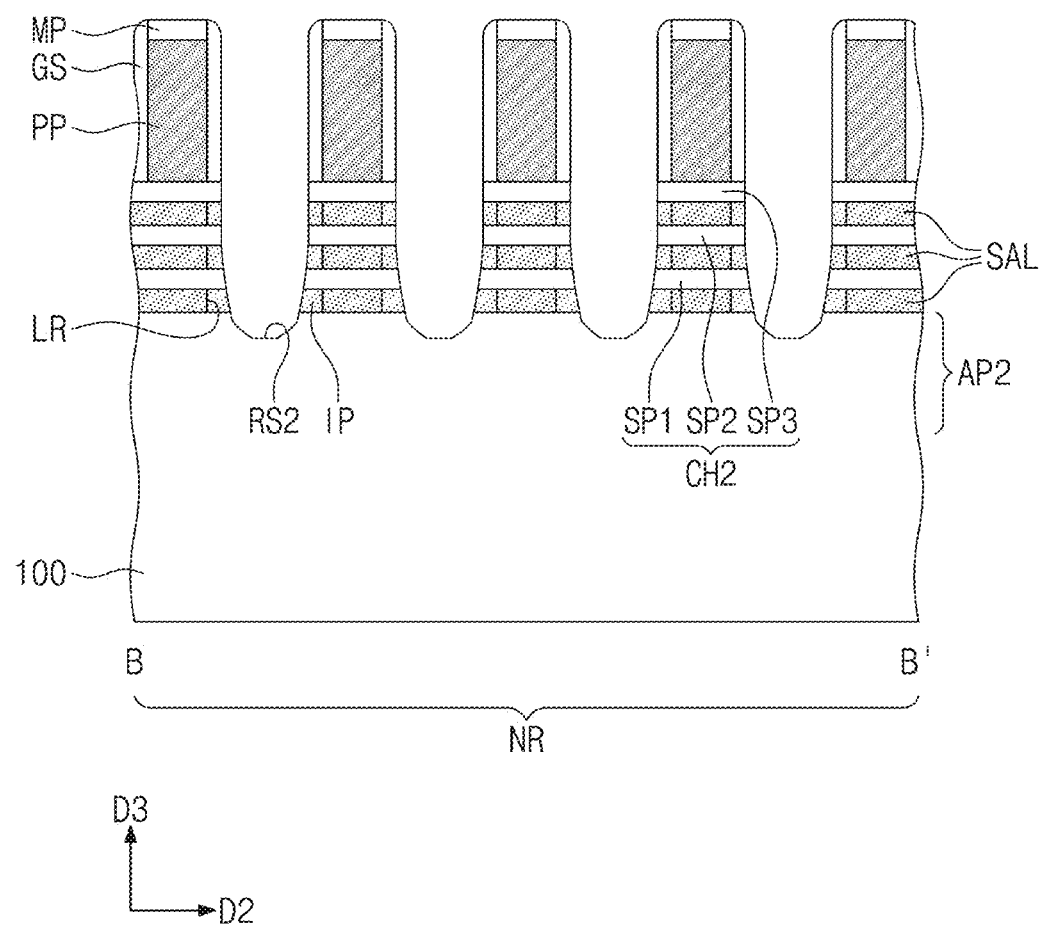
Figure 11B:
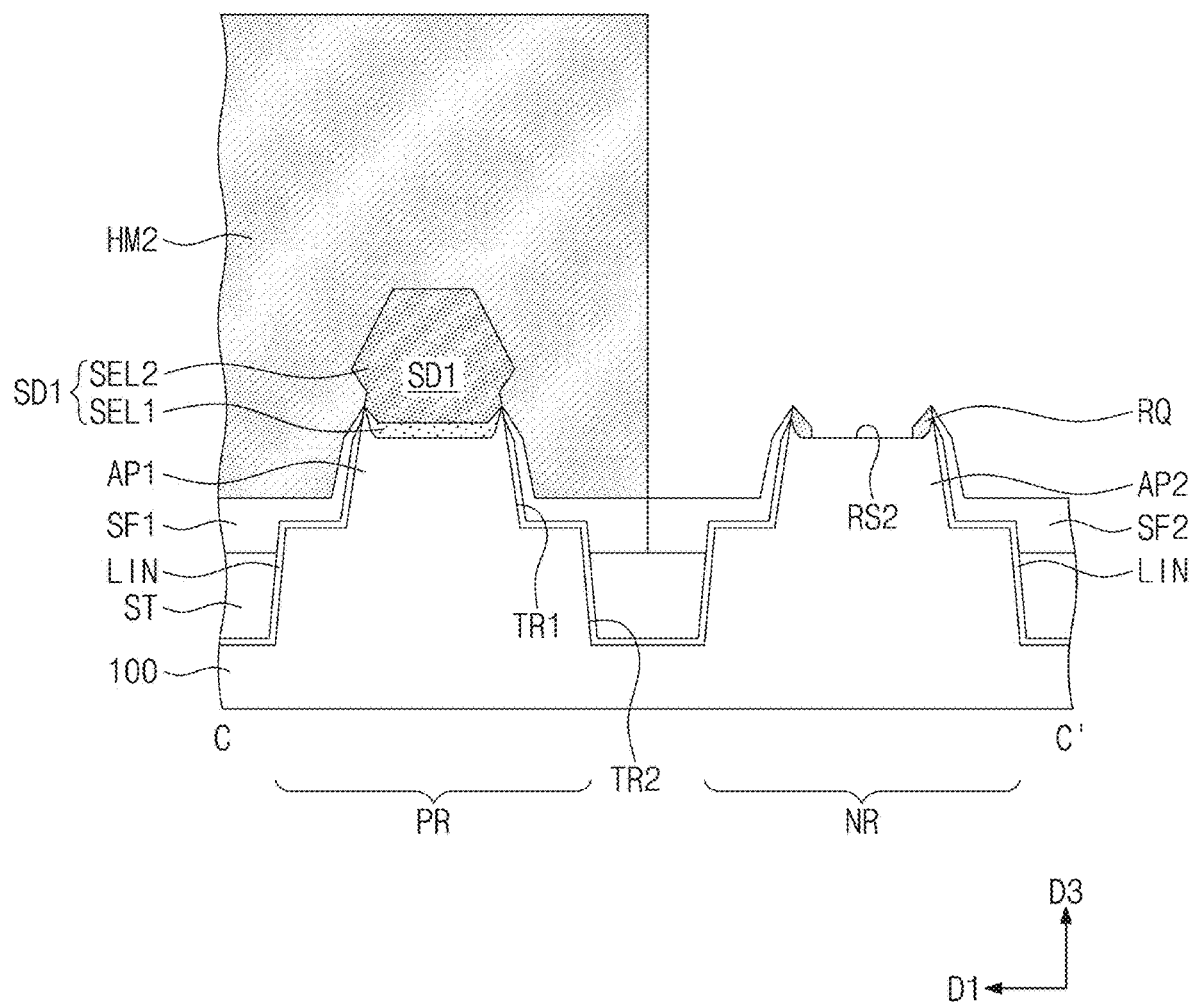
Figure 12A:
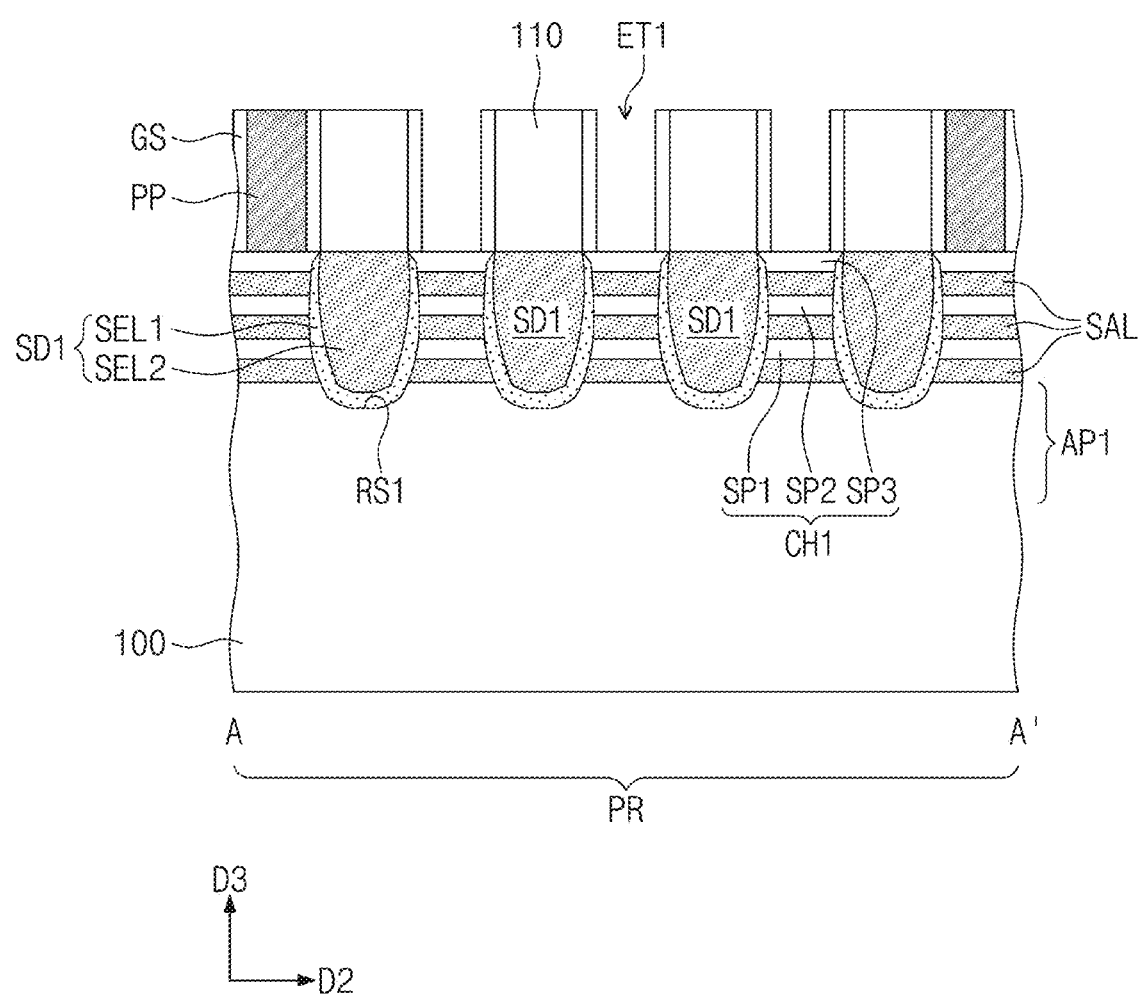
Figure 12B:
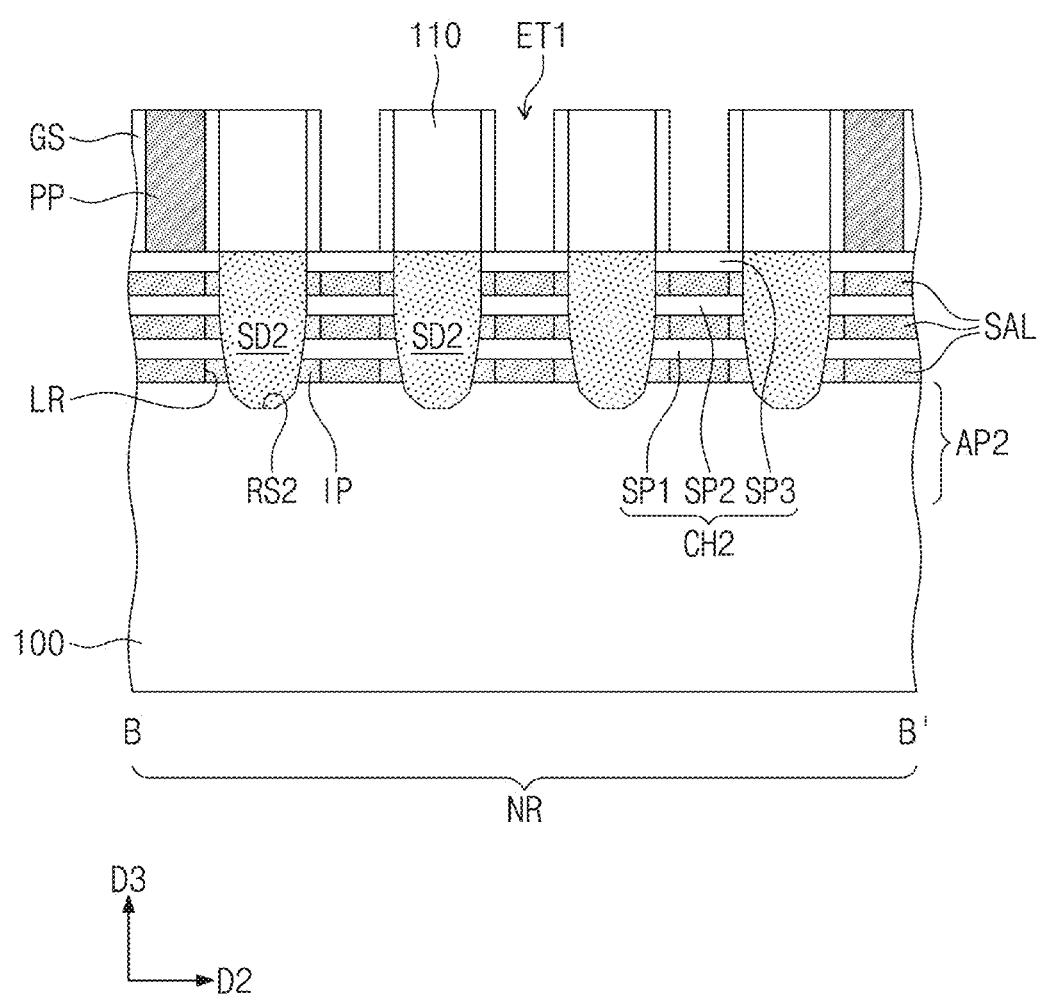
Figure 12C:
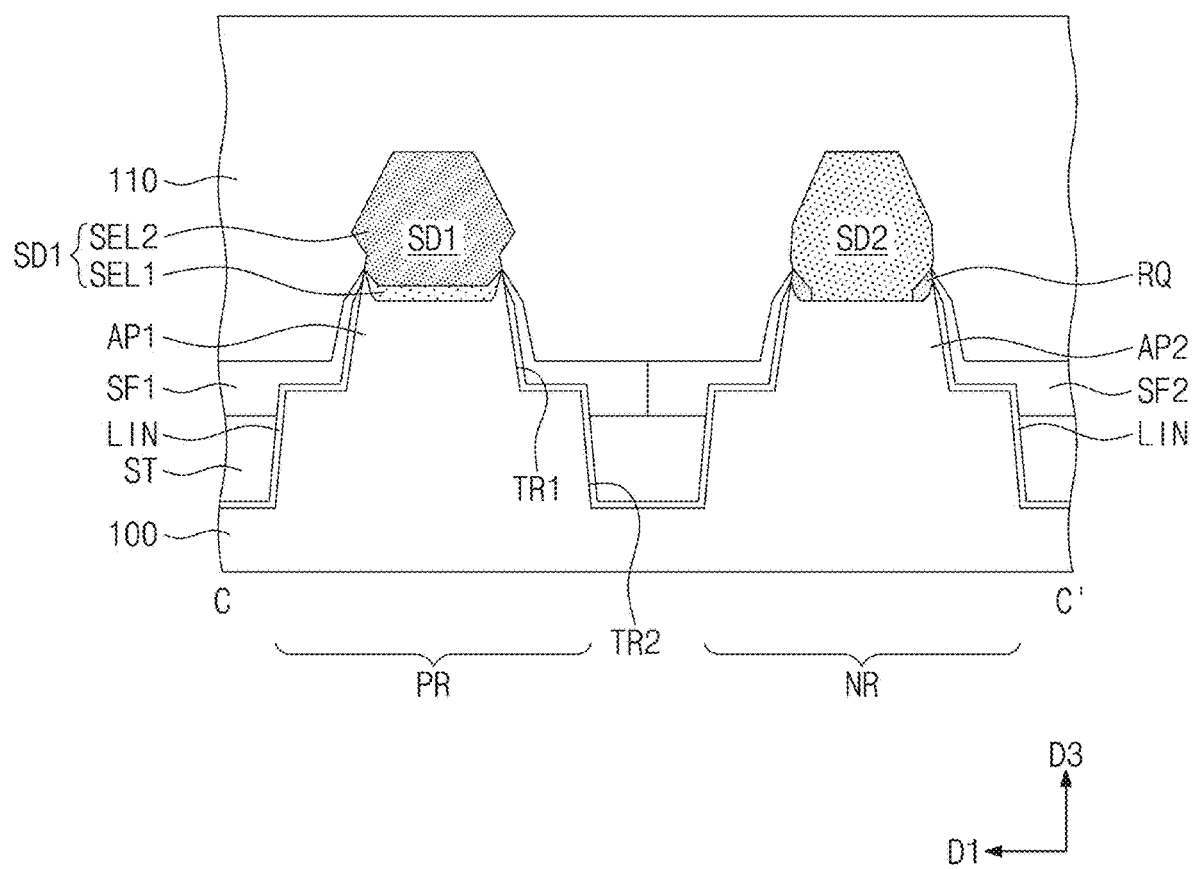
Figure 12D:
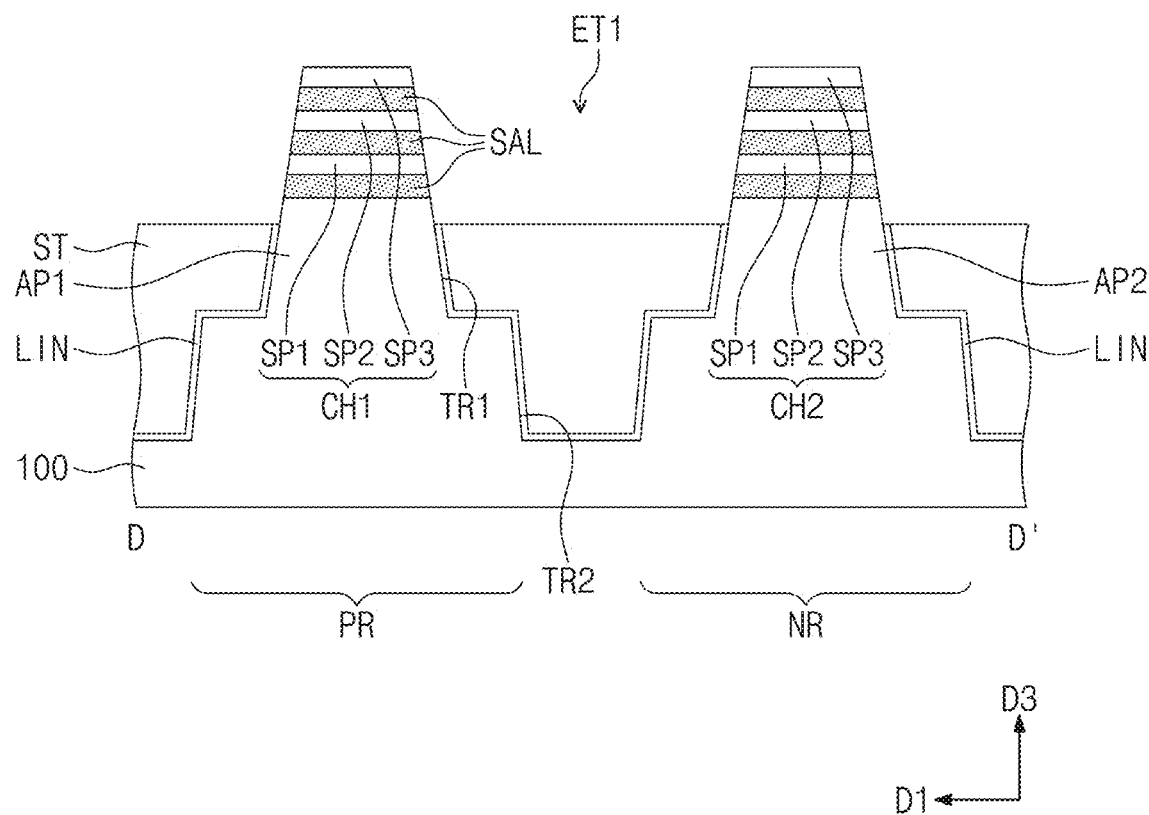

Referring to FIGS. 11A and 11B, the inner spacers IP may be formed to fill the horizontal recesses LR. The inner spacers IP may be formed by forming an insulating layer to cover the second recesses RS2 and performing an etching process on the insulating layer. During the formation of the inner spacers IP, a pair of the middle insulating patterns RQ may be formed on a top surface of the second active pattern AP2. The middle insulating patterns RQ may be formed adjacent to the edge portions EP described with reference to FIGS. 3A and 3B. For example, owing to the edge portions EP and the inner side surface of the second fence insulating layer SF2, a portion of the insulating layer, which is deposited to form the inner spacers IP, may be left on the top surface of the second active pattern AP2, and such a left portion of the insulating layer may form the middle insulating patterns RQ. The inner spacers IP and the middle insulating patterns RQ may be formed of a material, which has an etch selectivity or etch rate different from the second fence insulating layer SF2. For example, the middle insulating patterns RQ and the inner spacers IP may include SiN, and the second fence insulating layer SF2 may include SiOCN.

Referring to FIGS. 12A, 12B, 12C and 12D, the second source/drain patterns SD2 may be formed in the second recesses RS2, respectively. In detail, the second source/drain pattern SD2 may be formed by a SEG process, in which an inner surface of the second recess RS2 is used as a seed layer. In some example embodiments, the second source/drain pattern SD2 may be formed of, or include, the same semiconductor material (e.g., Si) as the substrate 100. The second source/drain pattern SD2 may be doped to have the second conductivity type (e.g., n-type). Due to its lateral growth, the second source/drain pattern SD2 may be formed to cover the middle insulating patterns RQ. Thereafter, the second mask pattern HM2 may be removed.

The first interlayer insulating layer 110 may be formed to cover the first and second source/drain patterns SD1 and SD2, the hard mask patterns MP, and the gate spacers GS. In some example embodiments, the first interlayer insulating layer 110 may be formed of, or include, silicon oxide. The first interlayer insulating layer 110 may be planarized to expose the top surfaces of the sacrificial patterns PP. The planarization of the first interlayer insulating layer 110 may be performed using an etch-back or chemical mechanical polishing (CMP) process. All of the hard mask patterns MP may be removed during the planarization process. Accordingly, the top surface of the first interlayer insulating layer 110 may be coplanar with the top surfaces of the sacrificial patterns PP and the top surfaces of the gate spacers GS.

The exposed sacrificial patterns PP may be selectively removed. As a result of the removal of the sacrificial pattern PP, upper trenches ET1 may be formed to expose side surfaces of the sacrificial layers SAL. Meanwhile, some of the sacrificial patterns PP may not be removed. For example, the sacrificial pattern PP located on a cell boundary may not be removed. In detail, by forming a mask layer on the sacrificial patterns PP that should not be removed, it may be possible to prevent, or reduce the occurrence of, the unintended removal of the sacrificial patterns PP.

Figure 13A:
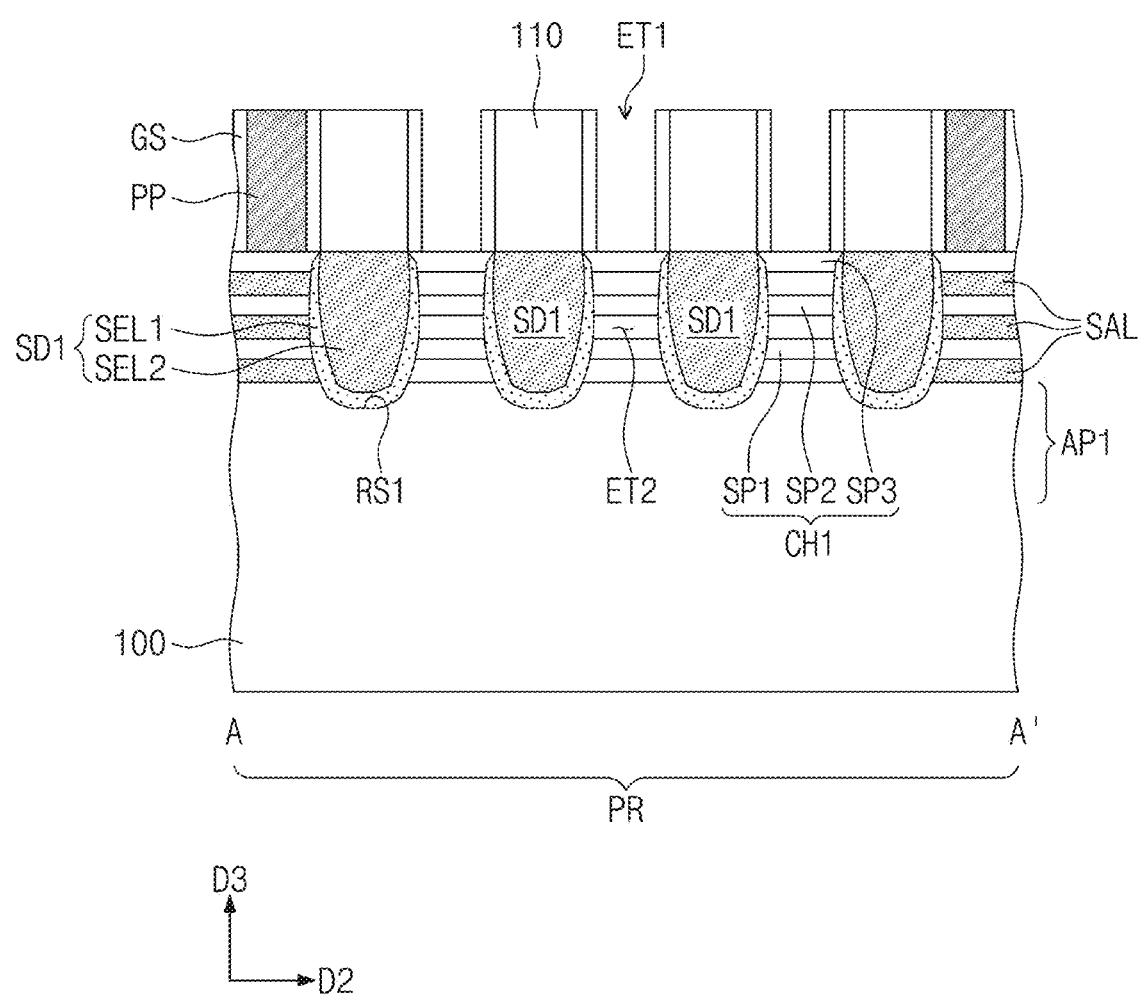
Figure 13B:
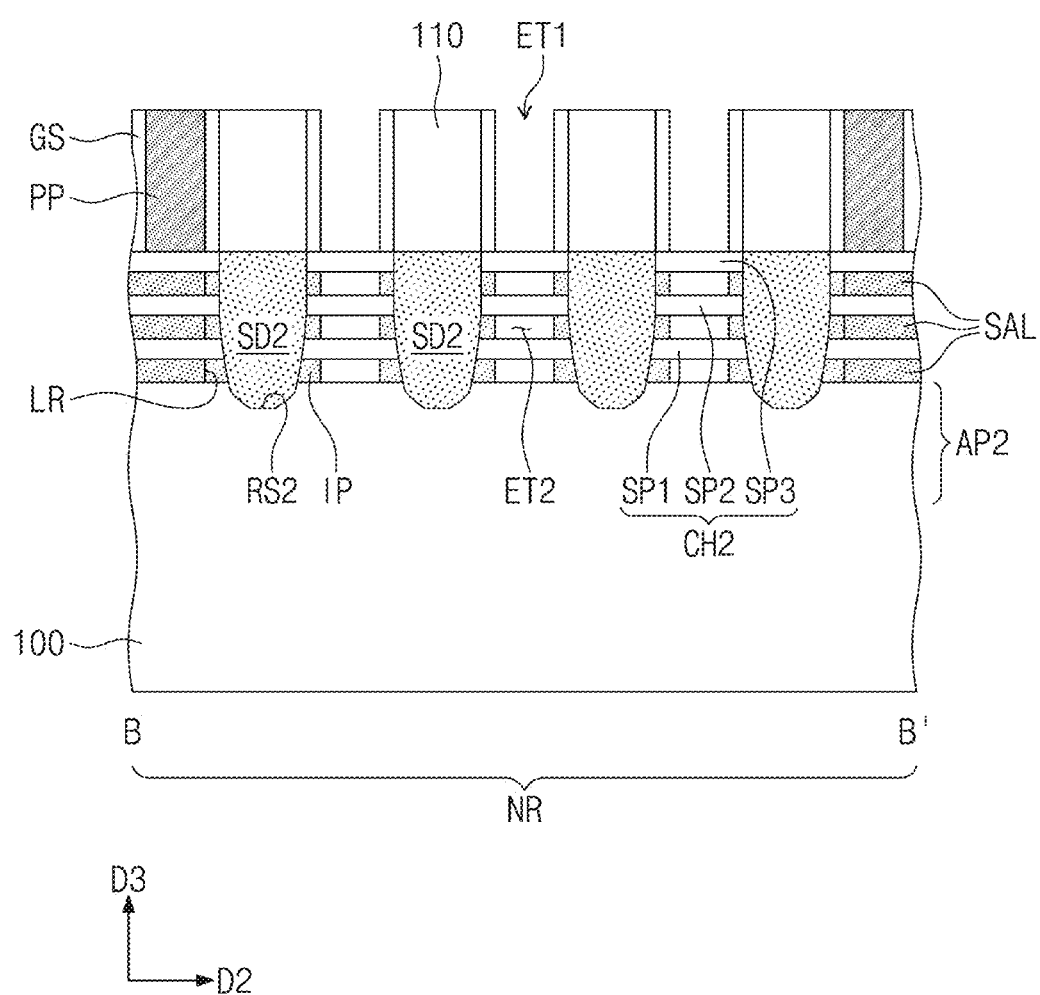
Figure 13C:
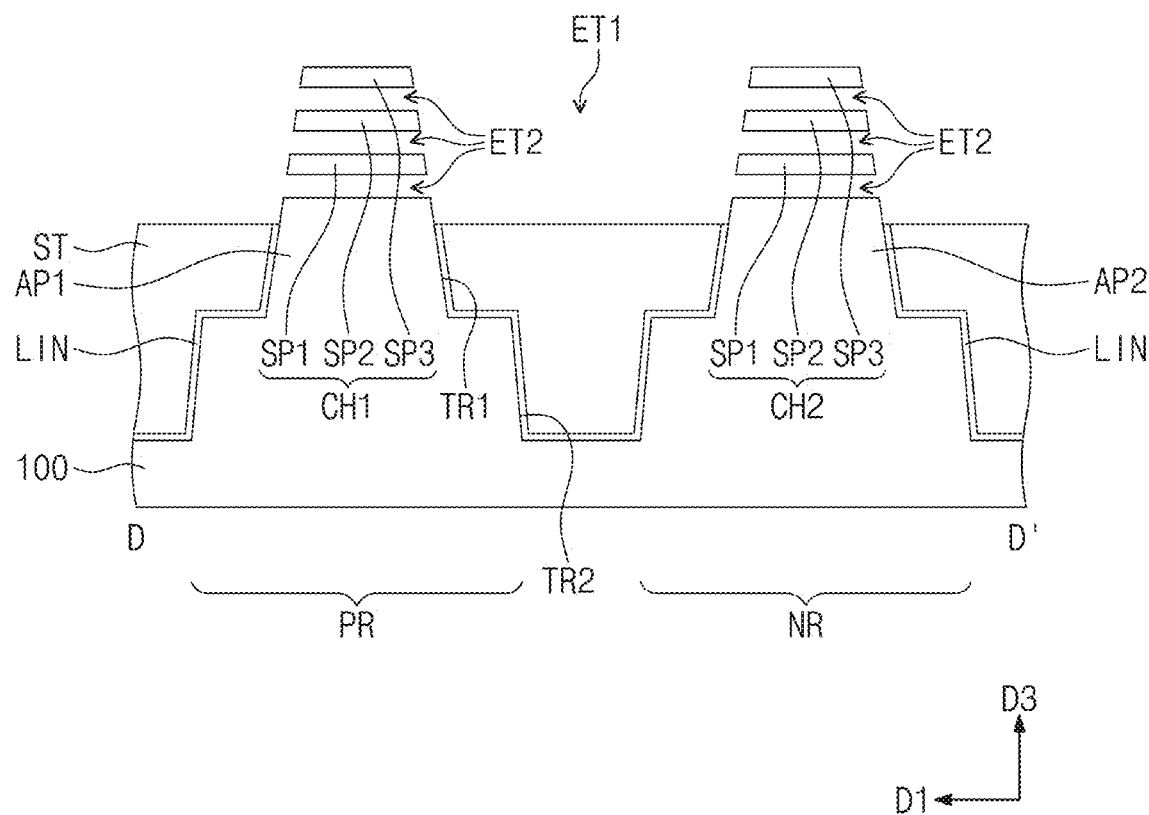
Figure 14A:
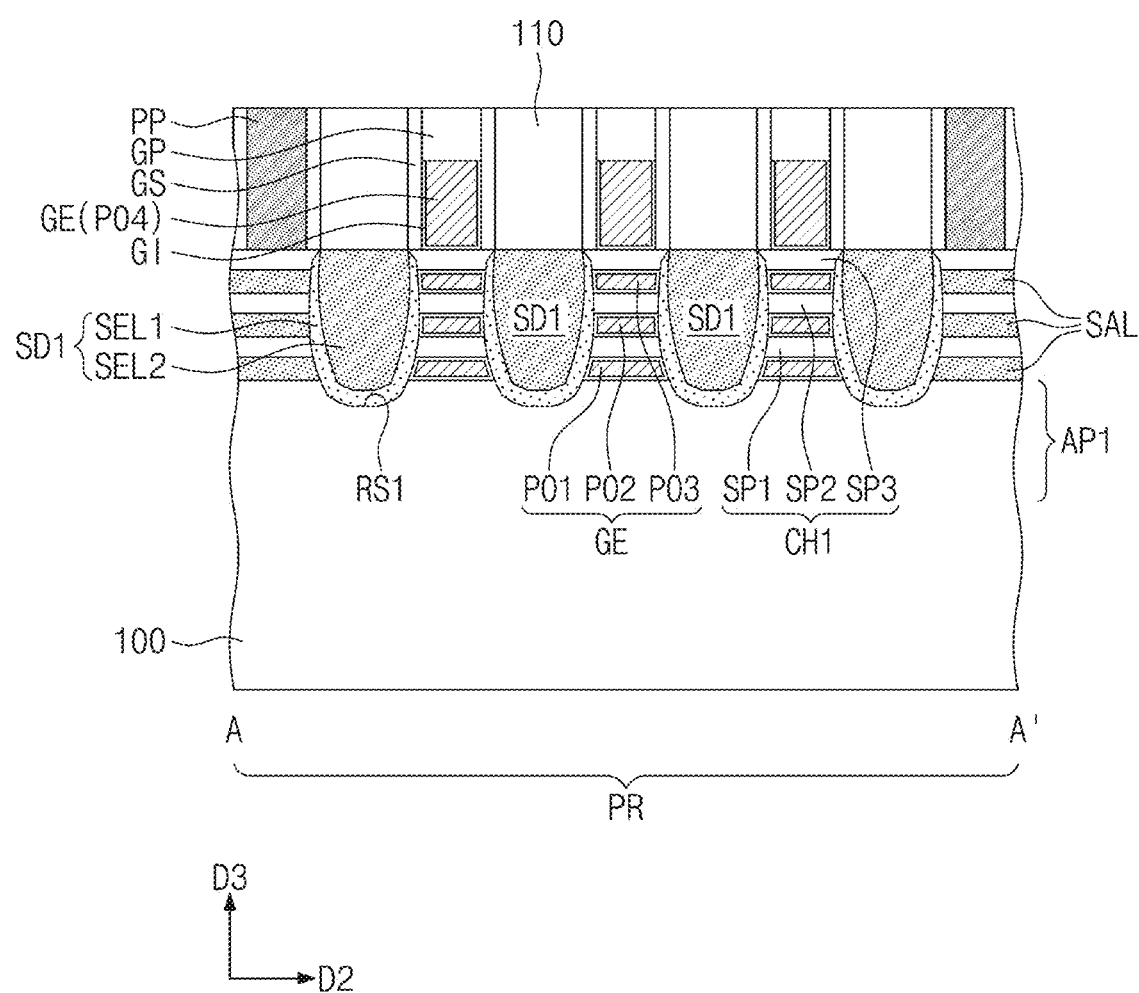
Figure 14B:
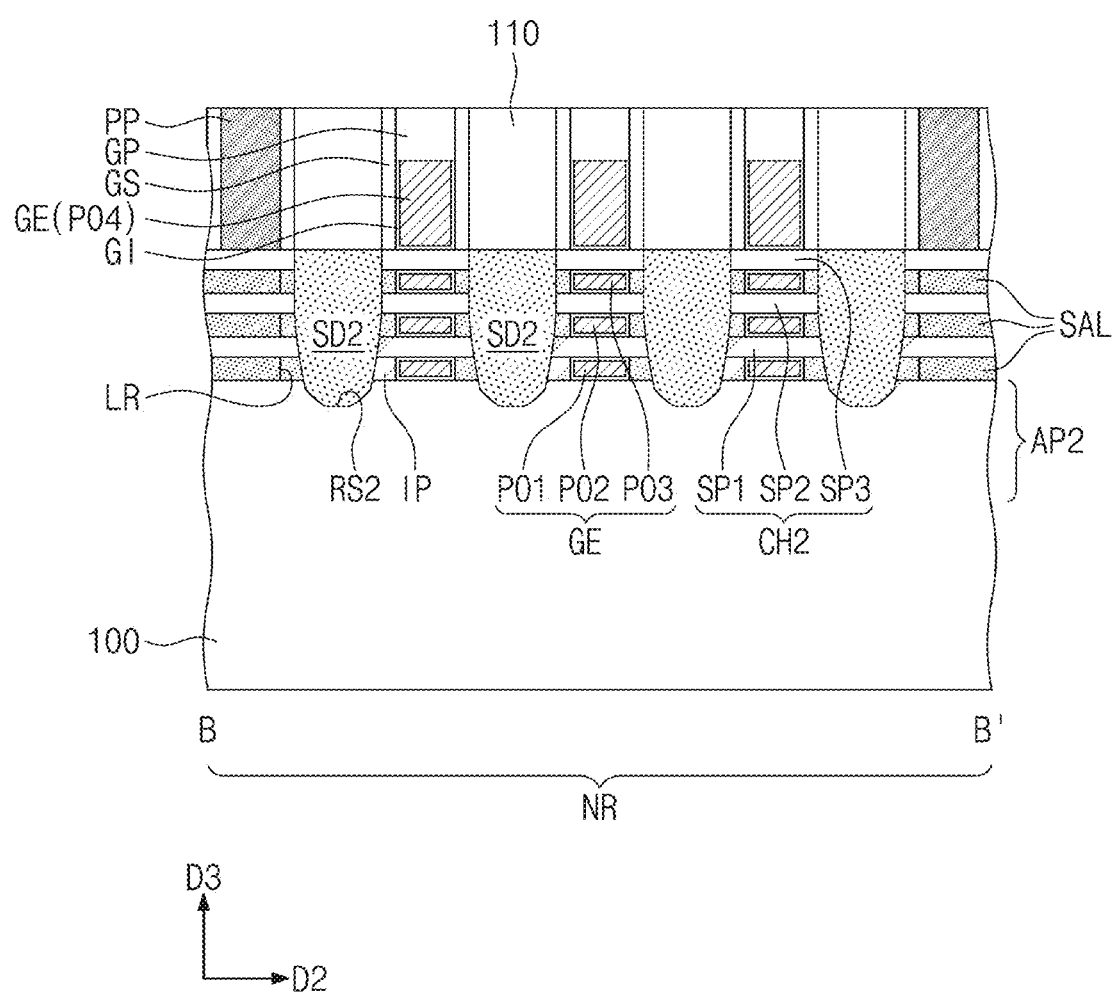
Figure 14C:
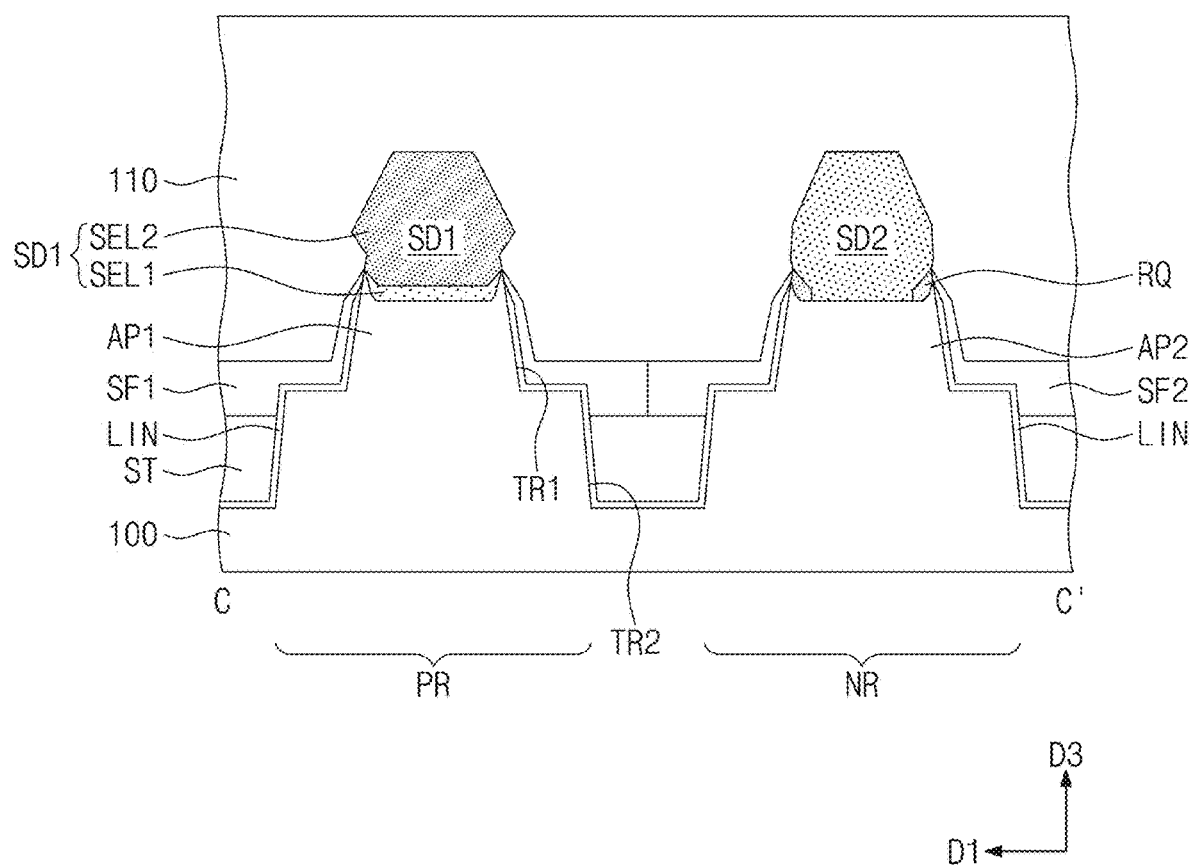
Figure 14D:
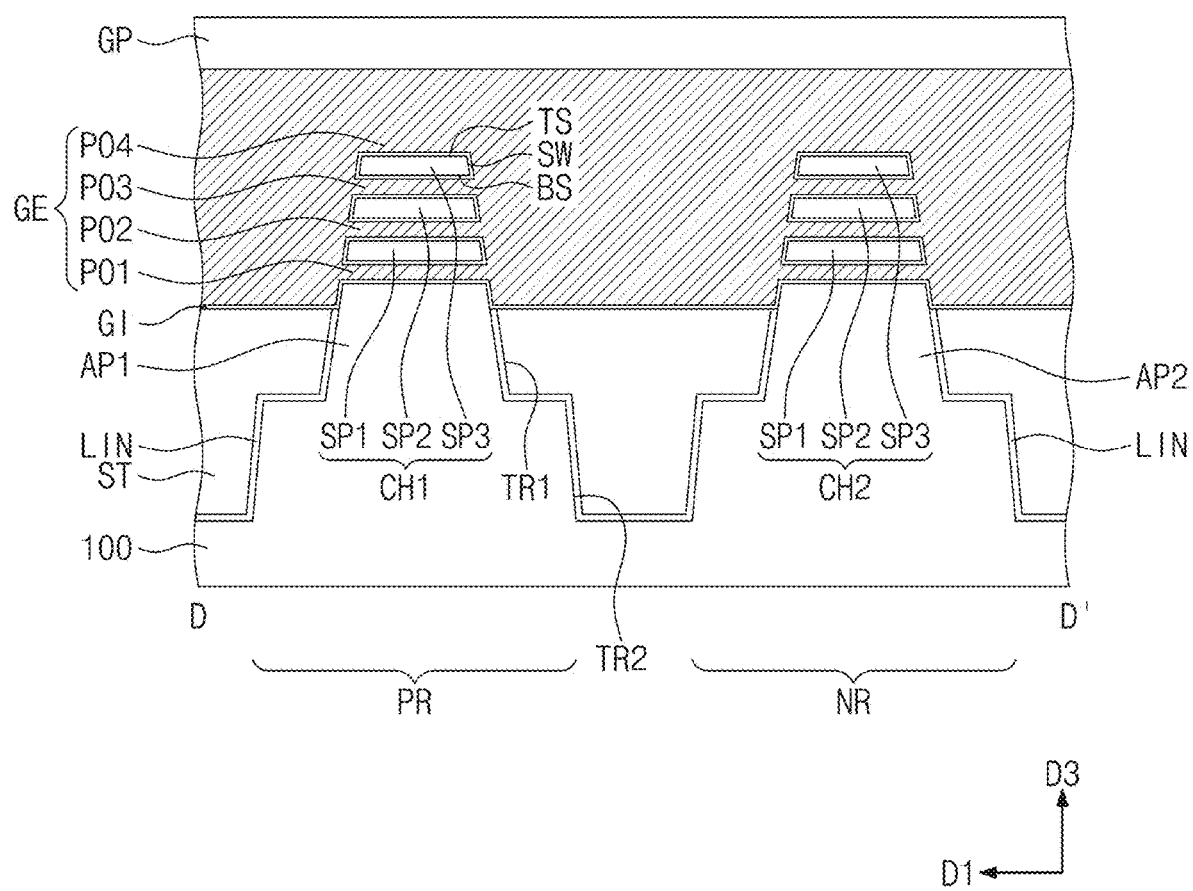

Referring to FIGS. 13A, 13B, and 13C, the sacrificial layers SAL, which are located on the PMOSFET region PR and the NMOSFET region NR exposed through the upper trenches ET1, may be selectively removed. In detail, an etching process of selectively etching only the sacrificial layers SAL may be performed to remove only the sacrificial layers SAL and to leave the first to third semiconductor patterns SP1, SP2, and SP3. Since the sacrificial layers SAL are selectively removed, only the first to third semiconductor patterns SP1, SP2, and SP3 may be left on each of the first and second active patterns AP1 and AP2. Hereinafter, empty regions, which are formed by removing the sacrificial layers SAL, will be referred to as third recesses ET2. The third recesses ET2 may be defined between the first to third semiconductor patterns SP1, SP2, and SP3.

Referring to FIGS. 14A, 14B, 14C and 14D, the gate insulating layer GI may be conformally formed in the upper trenches ET1 and the third recesses ET2. The gate electrode GE may be formed on the gate insulating layer GI. The gate electrode GE may be formed to fill the upper trenches ET1 and the third recesses ET2. In detail, the gate electrode GE may include the first to third portions P01, P02, and P03 filling the third recesses ET2. The gate electrode GE may further include the fourth portion P04 filling the upper trench ET1. The gate capping pattern GP may be formed on the gate electrode GE.

Referring back to FIGS. 1 and 2A to 2D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of dividing structures DB may be formed at both sides of the logic cell LC. In some example embodiments, the dividing structure DB may be formed to penetrate the second interlayer insulating layer 120, the remaining portion of the sacrificial pattern PP, and an upper portion of the active pattern AP1 or AP2 below the sacrificial pattern PP. The dividing structure DB may be formed of, or include, at least one of insulating materials (e.g., silicon oxide or silicon nitride). An upper portion of each of the active contacts AC adjacent to the gate contact GC may be removed and then may be filled with the upper insulating pattern UIP.

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 15A:
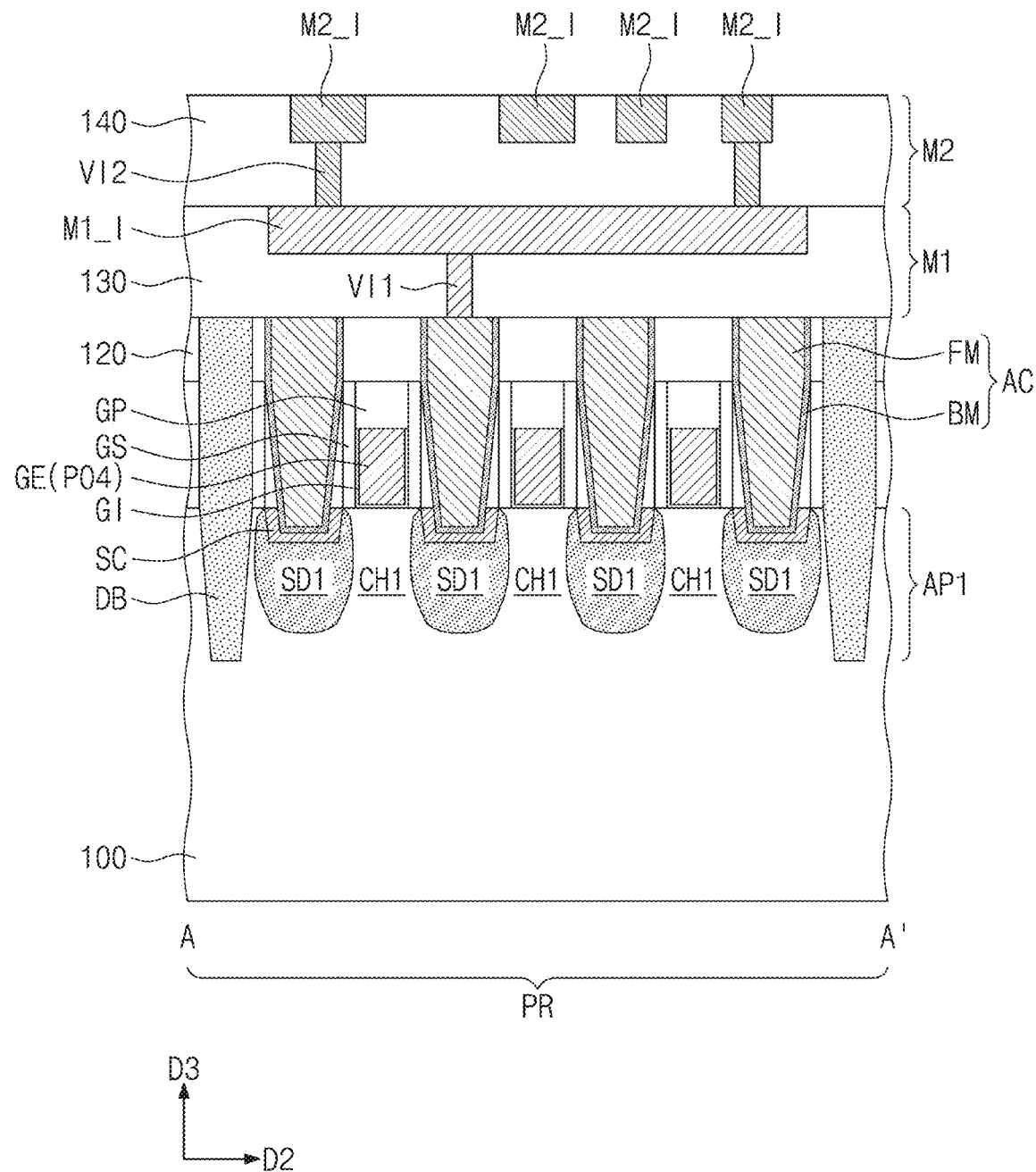
FIGS. 15A and 15B are sectional views taken along lines A-A' and B-B' of FIG. 1 to illustrate a semiconductor device according to example embodiments of the inventive concepts.
Figure 15B:
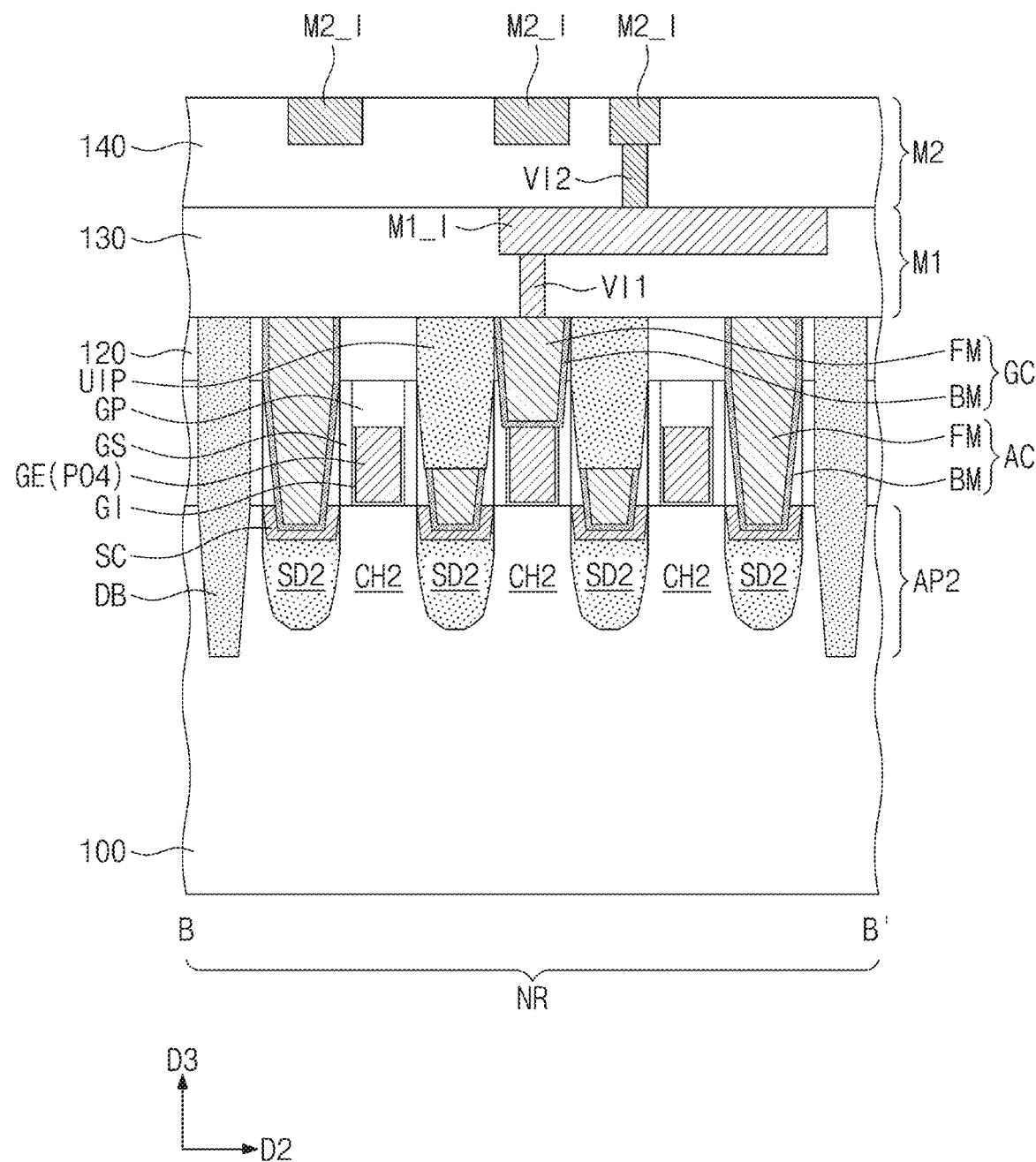

FIGS. 15A and 15B are sectional views taken along lines A-A' and B-B' of FIG. 1 to illustrate a semiconductor device according to some example embodiments of the inventive concepts.

According to the some example embodiments, the first active pattern AP1 may include the first channel pattern CH1, which is a fin-shaped pattern protruding from the substrate 100. The second active pattern AP2 may include the second channel pattern CH2 which is a fin-shaped pattern protruding from the substrate 100. The first and second channel patterns CH1 and CH2 may be semiconductor patterns, which are formed from an upper portion of the substrate 100, and may be connected to the substrate 100. Each of the gate electrodes GE may be extended along protruding top surfaces of the first and second channel patterns CH1 and CH2.

The first source/drain patterns SD1 may be provided in the first recesses between the first channel patterns CH1. The second source/drain patterns SD2 may be provided in the second recesses between the second channel pattern CH2. Other elements may be configured to have substantially the same features as those described with reference to FIGS. 2A to 2D.

In a semiconductor device according to some example embodiments of the inventive concepts, middle insulating patterns may be provided between an active pattern and a source/drain pattern on an NMOSFET region, and in this case, it may be possible to reduce a bottom leakage current. Accordingly, it may be possible to improve electric characteristics of the semiconductor device. Furthermore, the middle insulating patterns may not cover the entire top surface of the active pattern, and thus, the middle insulating patterns may not hinder, or reduce impeding, epitaxial growth of the source/drain pattern.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   an active pattern on a substrate;
   a source/drain pattern on the active pattern, the source/drain pattern including a bottom surface in contact with a top surface of the active pattern;
   a channel pattern connected to the source/drain pattern;
   a gate electrode extended to cross the channel pattern;
   a fence insulating layer extended from a side surface of the active pattern to a lower side surface of the source/drain pattern; and
   a pair of middle insulating patterns at both sides of the bottom surface of the source/drain pattern, the pair of middle insulating patterns being between the active pattern and the source/drain pattern in contact with an inner side surface of the fence insulating layer.

2. The semiconductor device of claim 1, wherein the pair of middle insulating patterns include a material different from a material of the fence insulating layer.

3. The semiconductor device of claim 1, wherein the middle insulating patterns include one of SiN, SiON, SiCN, or SiOCN.

4. The semiconductor device of claim 1, wherein the pair of middle insulating patterns are spaced apart from each other with the bottom surface of the source/drain pattern interposed therebetween.

5. The semiconductor device of claim 4, wherein each of the pair of middle insulating patterns are in contact with the source/drain pattern, the active pattern, and the fence insulating layer.

6. The semiconductor device of claim 4, wherein
   the active pattern includes a recess in an upper portion thereof, and
   the pair of middle insulating patterns and a lower portion of the source/drain pattern are in the recess.

7. The semiconductor device of claim 1, wherein
   the pair of middle insulating patterns and the bottom surface of the source/drain pattern cover the top surface of the active pattern,
   in a sectional view taken in an extension direction of the gate electrode, the pair of middle insulating patterns cover 10% to 30% of the top surface of the active pattern.

8. The semiconductor device of claim 1 comprising:
   a liner insulating layer between the fence insulating layer and the active pattern,
   wherein the pair of middle insulating patterns are connected to the liner insulating layer.

9. The semiconductor device of claim 1, wherein
   the channel pattern includes semiconductor patterns, which are stacked to spaced apart from each other,
   the semiconductor device further includes inner spacers interposed between the gate electrode and the source/drain pattern, and
   the pair of middle insulating patterns include the same material as the inner spacers.

10. The semiconductor device of claim 9, wherein
    the inner spacers are spaced apart from each other, in a direction perpendicular to the substrate, with the semiconductor patterns interposed therebetween, and
    the lowermost one of the inner spacers is located at the same level as the pair of middle insulating patterns.

11. The semiconductor device of claim 9, wherein the lowermost one of the inner spacers is connected to the pair of middle insulating patterns.

12. A semiconductor device, comprising:
    a substrate including a PMOSFET region and an NMOSFET region, which are adjacent to each other in a first direction;
    a first active pattern and a second active pattern on the PMOSFET region and the NMOSFET region, respectively;
    a first source/drain pattern on the first active pattern and a second source/drain pattern on the second active pattern;
    a first gate electrode and a second gate electrode crossing the first and second active patterns, respectively, and extending in the first direction;
    a first channel pattern connected to the first source/drain pattern and a second channel pattern connected to the second source/drain pattern, each of the first and second channel patterns including a first semiconductor pattern, a second semiconductor pattern and a third semiconductor pattern, which are sequentially stacked to be spaced apart from each other; and
    a pair of middle insulating patterns between the second source/drain pattern and the second active pattern, the pair of middle insulating patterns being at both sides of a bottom surface of the second source/drain pattern in contact with a top surface of the second active pattern, and being on the NMOSFET region.

13. The semiconductor device of claim 12, wherein a second contact area between the second source/drain pattern and the second active pattern is smaller than a first contact area between the first source/drain pattern and the first active pattern.

14. The semiconductor device of claim 12 comprising:
    a fence insulating layer extended from a side surface of the second active pattern to a lower side surface of the second source/drain pattern,
    wherein the pair of middle insulating patterns are in contact with an inner side surface of the fence insulating layer.

15. The semiconductor device of claim 12 comprising:
    inner spacers between the second gate electrode and the second source/drain pattern,
    wherein the pair of middle insulating patterns includes the same material as the inner spacers.

16. The semiconductor device of claim 15, wherein
    the inner spacers are spaced apart from each other, in a direction perpendicular to the substrate, with the first and second semiconductor patterns therebetween, and
    the lowermost one of the inner spacers is at the same level as the pair of middle insulating patterns.

17. The semiconductor device of claim 16, wherein the lowermost one of the inner spacers is connected to the pair of middle insulating patterns.

18. A semiconductor device, comprising:
    a substrate including a PMOSFET region and an NMOSFET region, which are adjacent to each other in a first direction;
    a first active pattern and a second active pattern on the PMOSFET and NMOSFET regions, respectively;
    a first source/drain pattern on the first active pattern and a second source/drain pattern on the second active pattern;
    a first channel pattern connected to the first source/drain pattern and a second channel pattern connected to the second source/drain pattern, each of the first and second channel patterns including a first semiconductor pattern, a second semiconductor pattern, and a third semiconductor pattern, which are sequentially stacked to be spaced apart from each other;

a first fence insulating layer extended from a side surface of the first active pattern to a lower side surface of the first source/drain pattern;

a second fence insulating layer extended from a side surface of the second active pattern to a lower side surface of the second source/drain pattern;

a pair of middle insulating patterns at both sides of a bottom surface of the second source/drain pattern and between the second active pattern and the second source/drain pattern in contact with an inner side surface of the second fence insulating layer;

a first gate electrode and a second gate electrode crossing the first and second active patterns, respectively, and extending in the first direction, each of the first and second gate electrodes including a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern;

inner spacers respectively between the first to third portions of the second gate electrode and the second source/drain pattern;

a first gate insulating layer and a second gate insulating layer respectively between the first channel pattern and the first gate electrode and between the second channel pattern and the second gate electrode;

a first gate spacer and a second gate spacer on side surfaces of the first and second gate electrodes, respectively;

a first gate capping pattern and a second gate capping pattern on top surfaces of the first and second gate electrodes, respectively;

a first interlayer insulating layer on the first and second gate capping patterns;

active contacts penetrating the first interlayer insulating layer and coupled to the first and second source/drain patterns, respectively;

gate contacts penetrating the first interlayer insulating layer and coupled to the first and second gate electrodes, respectively;

a second interlayer insulating layer on the first interlayer insulating layer;

a first metal layer in the second interlayer insulating layer, the first metal layer including first interconnection lines, which are electrically connected to the active contacts and the gate contacts, respectively;

a third interlayer insulating layer on the second interlayer insulating layer; and a second metal layer in the third interlayer insulating layer, the second metal layer including second interconnection lines, which are electrically connected to the first interconnection lines, respectively.

19. The semiconductor device of claim 18, wherein the lowermost one of the inner spacers is at the same level as the pair of middle insulating patterns.

20. The semiconductor device of claim 19, wherein the lowermost one of the inner spacers is connected to the pair of middle insulating patterns.

* * * * *